(12) United States Patent
Paseuth et al.

(10) Patent No.: US 10,434,580 B2
(45) Date of Patent: Oct. 8, 2019

(54) HARD COATING, CUTTING TOOL, AND METHOD FOR PRODUCING HARD COATING

(71) Applicant: SUMITOMO ELECTRIC HARDMETAL CORP., Itami-shi (JP)

(72) Inventors: Anongsack Paseuth, Sorachi-gun (JP); Takanori Detani, Sorachi-gun (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 84 days.

(21) Appl. No.: 15/117,359

(22) PCT Filed: Sep. 30, 2015

(86) PCT No.: PCT/JP2015/077696
§ 371 (c)(1),
(2) Date: Aug. 8, 2016

(87) PCT Pub. No.: WO2016/113956
PCT Pub. Date: Jul. 21, 2016

(65) Prior Publication Data
US 2017/0021429 A1    Jan. 26, 2017

(30) Foreign Application Priority Data

Jan. 14, 2015 (JP) .................. 2015-005295

(51) Int. Cl.
*B23B 27/14* (2006.01)
*C23C 16/34* (2006.01)
(Continued)

(52) U.S. Cl.
CPC ............ *B23B 27/148* (2013.01); *C23C 16/34* (2013.01); *C23C 16/44* (2013.01); *C23C 16/52* (2013.01);
(Continued)

(58) Field of Classification Search
CPC . C23C 14/0641; C23C 30/005; C23C 28/044; C23C 28/42; C23C 16/00;
(Continued)

(56) References Cited

U.S. PATENT DOCUMENTS

2004/0110039 A1* 6/2004 Horling .............. C23C 14/0641
428/698
2009/0123779 A1* 5/2009 Endler .................... C23C 16/34
428/697

(Continued)

FOREIGN PATENT DOCUMENTS

JP    2008-545063 A    12/2008
JP    2011-516722 A     5/2011
(Continued)

OTHER PUBLICATIONS

Notice of Grounds of Rejection in counterpart Japanese Patent Application No. 2015-005295, dated Oct. 18, 2016.
(Continued)

*Primary Examiner* — Humera N Sheikh
*Assistant Examiner* — Elizabeth D Ivey
(74) *Attorney, Agent, or Firm* — Baker Botts L.L.P.; Michael A. Sartori

(57) ABSTRACT

A hard coating includes two first crystalline phases, and a second crystalline phase containing AlN of a wurtzite-type crystal structure disposed therebetween. The two first crystalline phases each include, independently, a laminate structure having a $Ti_{1-x1}Al_{x1}N$ phase having a sodium chloride-type crystal structure, and an $Al_{x2}Ti_{1-x2}N$ phase having a sodium chloride-type crystal structure that are alternately stacked. An Al composition ratio x1 satisfies a relationship $0.5 \le x1 \le 0.75$, and an Al composition ratio x2 satisfies a relationship $0.75 < x2 \le 0.95$. The laminate structure includes a region in which an Al concentration periodically changes
(Continued)

along a stacking direction of the $Ti_{1-x1}Al_{x1}N$ phase and the $Al_{x2}Ti_{1-x2}N$ phase. In this region, a difference between a maximum value of the Al composition ratio x2 and a minimum value of the Al composition ratio x1 is greater than 0.25.

8 Claims, 11 Drawing Sheets

(51) Int. Cl.
  *C23C 16/52* (2006.01)
  *C23C 16/44* (2006.01)
  *B23F 21/00* (2006.01)
(52) U.S. Cl.
  CPC ..... *B23B 2228/04* (2013.01); *B23B 2228/105* (2013.01); *B23F 21/00* (2013.01)
(58) Field of Classification Search
  CPC ....... C23C 16/34; C23C 18/1637; C23C 8/24; C23C 14/06; C23C 28/34; C23C 28/347; C23C 28/44; C23C 28/04; C23C 14/00; C23C 14/18
  USPC .................................. 428/336, 697, 698, 699
  See application file for complete search history.

(56) References Cited

U.S. PATENT DOCUMENTS

2010/0323176 A1   12/2010   Van Den Berg et al.
2012/0219789 A1   8/2012    Endler et al.
2015/0345013 A1   12/2015   Paseuth et al.
2016/0319439 A1*  11/2016   Kumar .................... C04B 35/66
2016/0333473 A1*  11/2016   Stiens .................... C23C 16/34

FOREIGN PATENT DOCUMENTS

JP           2013-510946 A        3/2013
JP           2014-129562 A        7/2014
JP           2014-133267 A        7/2014
JP     WO 2014103533 A1 *         7/2014  ............. C23C 16/34
JP           2016-049573 A        4/2016
JP           2016-064485 A        4/2016

OTHER PUBLICATIONS

International Search Report in International Application No. PCT/JP2015/077696, dated Dec. 22, 2015.
Endler et al., "Novel aluminum-rich $Ti_{1-x}Al_xN$ coatings by LPCVD," Surface and Coatings Technology, 2008, vol. 203.
Keckes et al., "Self-organized periodic soft-hard nanolamellae in polycrystalline TiAlN thin films," Thin Solid Films, 2013, vol. 545.
Todt et al., "Superior oxidation resistance, mechanical properties and residual stresses of an Al-rich nanolamellar $Ti_{0.05}Al_{0.95}N$ coating prepared by CVD," Surface and Coatings Technology, 2014.
Horling, et al., "Thermal stability of arc evaporated high aluminum-content $Ti_{1-x}Al_xN$ thin films," Journal of Vacuum Science & Technology A: Vacuum, Surface, and Films, 20 (2002), pp. 1815-1823.

* cited by examiner (a)

(b)

HARD COATING, CUTTING TOOL, AND METHOD FOR PRODUCING HARD COATING

TECHNICAL FIELD

The present invention relates to a hard coating, a cutting tool, and a method for producing a hard coating.

BACKGROUND ART

Cutting work on steel products, castings, and the like has conventionally been carried out using a cutting tool formed of cemented carbide. Such cutting tool often suffers from a problem of wear or fracturing damage of the cutting edge during cutting work due to exposure of the cutting edge to a tough environment, such as high temperature and high pressure. Thus, the cutting tool has a problem in cutting performance.

Therefore, a coating for coating a surface of a base member, such as one formed of cemented carbide, has been under development for the purpose of improving cutting performance of cutting tools. Among others, a coating formed of a compound of titanium (Ti), aluminum (Al), and nitrogen (N) (hereinafter also referred to as "TiAlN") can have high hardness, and can improve oxidation resistance by increasing the content ratio of Al. Since performance of a cutting tool can be improved by coating the cutting tool with such a coating, further development of such coating is demanded.

For example, PTD 1 discloses a hard coating that includes at least one $Ti_{1-x}Al_xN$ hard coating produced by means of chemical vapor deposition (CVD) without plasma excitation. The $Ti_{1-x}Al_xN$ hard coating is present as a monophase layer of a cubic NaCl structure having a stoichiometric coefficient of $x>0.75$ up to $x=0.93$ and a lattice constant $a_{fcc}$ of from 0.412 nm to 0.405 nm; or the $Ti_{1-x}Al_xN$ hard coating has a primary phase formed of $Ti_{1-x}Al_xN$ having a cubic NaCl structure having a stoichiometric coefficient of $x>0.75$ up to $x=0.93$ and a lattice constant $a_{fcc}$ of from 0.412 nm to 0.405 nm. In addition, the $Ti_{1-x}Al_xN$ hard coating is a multiphase layer including, as an additional phase, $Ti_{1-x}Al_xN$ in a wurtzite structure and/or $TiN_x$ in a NaCl structure, and the chlorine content rate of $Ti_{1-x}Al_xN$ hard coating is in a range of from 0.05 to 0.9 atomic %. NPD 1 also discloses a similar technique.

NPD 2 discloses a $Ti_{0.05}Al_{0.95}N$ film having a thickness of 5 μm, deposited on a substrate such as one formed of WC—Co by a CVD method using $AlCl_3$, $TiCl_4$, $N_2$, and $NH_3$ as the reactant gases, and $H_2$ as the carrier gas, under conditions of a pressure of 3 kPa and a temperature of 800° C. The $Ti_{0.05}Al_{0.95}N$ film of NPD 2 has a nanolaminate structure having a self-organized cubic TiN (c-TiN) layer and a wurtzite AlN (w-AlN) layer being alternately stacked, and a separation region formed of w-AlN and cubic AlN (c-AlN). In this nanolaminate structure, a (110) plane of c-TiN and a (100) plane of w-AlN are parallel to each other. The ratios of w-AlN, c-AlN (c-Al(Ti)N), and c-TiN that form the $Ti_{0.05}Al_{0.95}N$ film of NPD 2 are 53%, 26%, and 21%, respectively. NPD 2 also discloses that the hardness of the $Ti_{0.05}Al_{0.95}N$ film is about 28 GPa, and that the compressive residual stress of c-Al(Ti)N is −1.2±0.1 GPa.

NPD 3 discloses evaluation of oxidation resistance of a $Ti_{0.05}Al_{0.95}N$ film having a nanolaminate structure having a self-organized c-TiN layer and a w-AlN layer being alternately stacked. According to the description of NPD 3, when the $Ti_{0.05}Al_{0.95}N$ film was oxidized at temperatures from 700° C. to 1200° C. in air for one hour, the $Ti_{0.05}Al_{0.95}N$ film had good oxidation resistance up to 1050° C., whereas local degradation of the surface occurred after the temperature exceeded 1100° C. NPD 3 also discloses that the hardness of about 29 GPa and the compressive residual stress of 2 GPa of the $Ti_{0.05}Al_{0.95}N$ film are maintained up to a temperature of 1050° C.

PTD 2 discloses a method for producing, by a CVD method, a hard coating having a structure in which a TiN layer of 2 nm thick having a face-centered cubic lattice (fcc) structure and an AlN layer of 6 nm thick having an fcc structure are alternately stacked, by introducing $AlCl_3$ gas, $TiCl_4$ gas, $NH_3$ gas, $H_2$ gas, and $N_2$ gas into a reaction vessel at a pressure of 1.3 kPa and a temperature of 800° C., and then cooling the reaction vessel at a cooling rate of 10° C./min until the temperature of the base member reaches 200° C. (see paragraphs 0062 and 0063 of PTD 2).

CITATION LIST

Patent Document

PTD 1: National Patent Publication No. 2008-545063
PTD 2: Japanese Patent Laying-Open No. 2014-129562

Non Patent Document

NPD 1: I. Endler et al., "Novel aluminum-rich $Ti_{1-x}Al_xN$ coatings by LPCVD," Surface & Coatings Technology 203 (2008) 530-533
NPD 2: J. Keckes et al., "Self-organized periodic soft-hard nanolamellae in polycrystalline TiAlN thin films," Thin Solid Films 545 (2013) 29-32
NPD 3: J. Todt et al., "Superior oxidation resistance, mechanical properties and residual stresses of an Al-rich nanolamellar $Ti_{0.05}Al_{0.95}N$ coating prepared by CVD," Surface & Coatings Technology (2014).

SUMMARY OF INVENTION

Technical Problems

However, the $Ti_{1-x}Al_xN$ hard coatings described in PTD 1 and NPD 1 have values of x in the $Ti_{1-x}Al_xN$ hard coatings of higher than 0.7, and are thus in a high strain state. Such coatings are quasi-stable in cubic crystals, and thus, exposure of the coatings to a high temperature may result in phase transition to a wurtzite structure, thereby causing a reduction in the hardness. Thus, when the $Ti_{1-x}Al_xN$ hard coatings of PTD 1 and NPD 1 are used in cutting tools, phase transition to a wurtzite structure caused by frictional sliding heat during cutting work results in a reduction in the hardness, and thus wear resistance of the $Ti_{1-x}Al_xN$ hard coatings is reduced. As a result, particularly in low-speed cutting, chipping of the $Ti_{1-x}Al_xN$ hard coatings occurs, and thus life extension of a cutting tool cannot be achieved.

The $Ti_{0.05}Al_{0.95}N$ films described in NPD 2 and NPD 3 each have a nanolaminate structure having a self-organized c-TiN layer and a w-AlN layer being alternately stacked, and therefore, do not suffer from a problem that phase transition to the wurtzite structure caused by frictional sliding heat results in a reduction in the hardness during cutting work, unlike those of PTD 1 and NPD 1. However, the nanolaminate structures of the $Ti_{0.05}Al_{0.95}N$ films described in NPD 2 and NPD 3 each contain w-AlN having a lower hardness than that of c-TiN in a higher content than that of c-TiN. This reduces the hardness of the overall $Ti_{0.05}Al_{0.95}N$ films.

Therefore, the $Ti_{0.05}Al_{0.95}N$ films described in NPD 2 and NPD 3 cannot have sufficiently high wear resistance, and thus life extension of a cutting tool cannot be achieved.

In PTD 2, the hard coating is formed only of a structure in which an fcc structure TiN layer and an fcc structure AlN layer are alternately stacked. Therefore, the hardness of the hard coating is significantly high, and the wear resistance of the hard coating is high. However, when the hard coating described in PTD 2 is used in a cutting tool, high-speed cutting may cause chipping, and depending on the work material, may suddenly cause a fracture, which may prevent life extension of a cutting tool. The reason for this is unclear, but this is supposedly due to tensile residual stress generated in the fcc structure AlN caused by a lattice mismatch between the fcc structure TiN and the fcc structure AlN in the stacking direction. That is, the lattice constant of the fcc structure AlN is from about 0.412 nm to about 0.405 nm, and the lattice constant of the fcc structure TiN is about 0.424 nm; and a structure in which the fcc structure TiN and the fcc structure AlN are alternately stacked forms a nanoscale, super-multilayer structure. This always requires the fcc structure AlN having the smaller lattice constant to match the fcc structure TiN having the larger lattice constant. This generates tensile residual stress in the fcc structure AlN. The chipping and fracture described above are considered to be caused by tensile residual stress in the fcc structure AlN.

Thus, a cutting tool having a long life has not yet been achieved, and development of such cutting tool is desired.

Solutions to Problems

A hard coating according to one aspect of the present invention includes two first crystalline phases, and a second crystalline phase disposed between the two first crystalline phases. The two first crystalline phases each include, independently, a laminate structure having a $Ti_{1-x1}Al_{x1}N$ phase having a sodium chloride-type crystal structure, and an $Al_{x2}Ti_{1-x2}N$ phase having a sodium chloride-type crystal structure that are alternately stacked, an Al composition ratio x1 of the $Ti_{1-x1}Al_{x1}N$ phase satisfies a relationship $0.5 \leq x1 \leq 0.75$, an Al composition ratio x2 of the $Al_{x2}Ti_{1-x2}N$ phase satisfies a relationship $0.75 < x2 \leq 0.95$, the laminate structure includes a region in which an Al concentration periodically changes along a stacking direction of the $Ti_{1-x1}Al_{x1}N$ phase and the $Al_{x2}Ti_{1-x2}N$ phase, in this region, a difference between a maximum value of the Al composition ratio x2 and a minimum value of the Al composition ratio x1 ((maximum value of Al composition ratio x2)−(minimum value of Al composition ratio x1); the same definition will apply hereinafter) is greater than 0.25, and the second crystalline phase contains AlN having a wurtzite-type crystal structure.

A cutting tool according to another aspect of the present invention is a cutting tool including a base member, and the aforementioned hard coating on the base member.

A method for producing a hard coating according to still another aspect of the present invention includes an ejection step of ejecting, onto a base member, each of a first gas containing halogenated titanium gas and halogenated aluminum gas, and a second gas containing ammonia gas, a first cooling step of cooling the base member to a temperature higher than or equal to 700° C. and lower than or equal to 750° C. at a cooling rate higher than 10° C./min, a maintenance step of maintaining the base member at a temperature higher than or equal to 700° C. and lower than or equal to 750° C., and a second cooling step of cooling the base member after the maintenance step, and a cooling rate for the base member in the second cooling step is lower than the cooling rate for the base member in the first cooling step.

Advantageous Effects of Invention

According to the foregoing, a hard coating capable of producing a long-life cutting tool, a cutting tool, and a method for producing a hard coating can be provided.

DESCRIPTION OF EMBODIMENTS

Description of Embodiment of Present Invention

Figure 1:
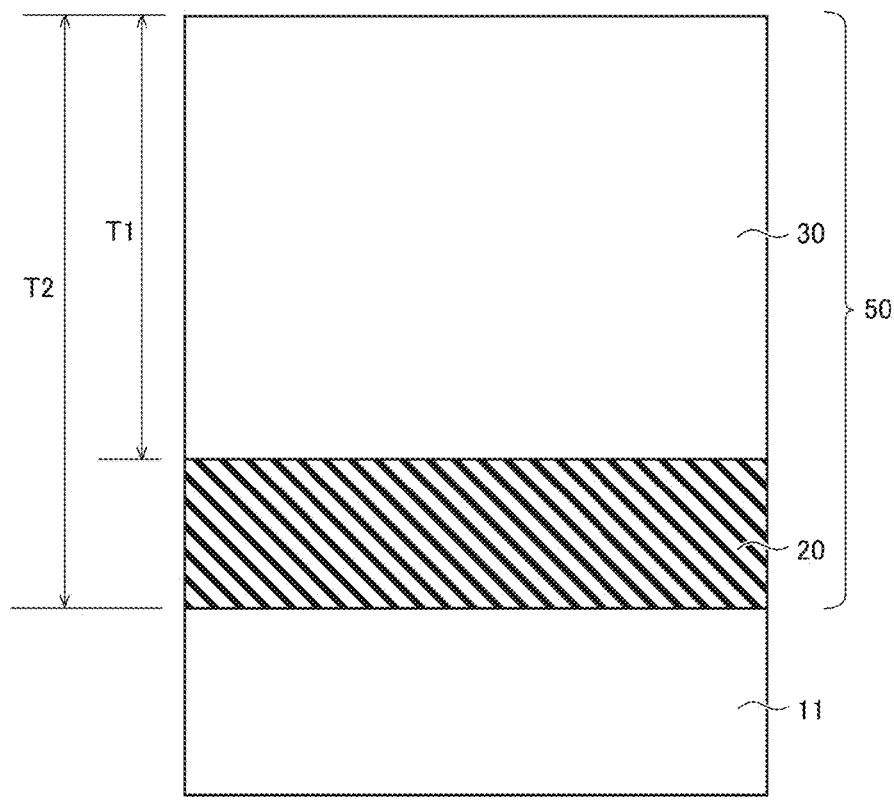
FIG. 1 is a schematic cross-sectional view of a cutting tool of an embodiment.

To begin with, aspects of the present invention will be described in sequence.

(1) A hard coating according to one aspect of the present invention includes two first crystalline phases, and a second crystalline phase disposed between the two first crystalline phases. The two first crystalline phases each include, independently, a laminate structure having a $Ti_{1-x1}Al_{x1}N$ phase having a sodium chloride-type crystal structure, and an $Al_{x2}Ti_{1-x2}N$ phase having a sodium chloride-type crystal structure that are alternately stacked, an Al composition ratio x1 of the $Ti_{1-x1}Al_{x1}N$ phase satisfies a relationship $0.5 \leq x1 \leq 0.75$, an Al composition ratio x2 of the $Al_{x2}Ti_{1-x2}N$ phase satisfies a relationship $0.75 < x2 \leq 0.95$, the laminate structure includes a region in which an Al concentration periodically changes along a stacking direction of the $Ti_{1-x1}Al_{x1}N$ phase and the $Al_{x2}Ti_{1-x2}N$ phase, in this region, a difference between a maximum value of the Al composition ratio x2 and a minimum value of the Al composition ratio x1 is greater than 0.25, and the second crystalline phase contains AlN having a wurtzite-type crystal structure. Using such configuration, impact exerted on the two first crystalline phases during cutting can be alleviated by the second crystalline phase located between the two first crystalline phases, and thus life extension of a cutting tool can be achieved.

(2) In a hard coating according to one aspect of the present invention, the total thickness of the per-phase thickness of the $Ti_{1-x1}Al_{x1}N$ phase and the per-phase thickness of the $Al_{x2}Ti_{1-x2}N$ phase, the phases located next to each other, is preferably greater than or equal to 1 nm and less than or equal to 50 nm. When the total thickness is greater than or equal to 1 nm, production of a hard coating is easy. When the total thickness is less than or equal to 50 nm, strain relaxation at a boundary between the $Ti_{1-x1}Al_{x1}N$ phase and the $Al_{x2}Ti_{1-x2}N$ phase located next to each other, and reduction in wear resistance of the hard coating caused by phase transition of the $Al_{x2}Ti_{1-x2}N$ phase having a high Al composition ratio can be inhibited.

(3) In a hard coating according to one aspect of the present invention, an electron diffraction image of the second crystalline phase by a transmission electron microscope preferably exhibits a concentric pattern, and a ratio of a diffraction intensity P1 of a (200) plane of the $Al_{x2}Ti_{1-x2}N$ phase to a sum of the diffraction intensity P1 and a diffraction intensity P2 of a (100) plane of the second crystalline phase in an X-ray diffraction pattern of the hard coating by an X-ray diffraction method is preferably greater than or equal to 0.2 and less than or equal to 1. When an electron diffraction image of the second crystalline phase by a TEM exhibits a concentric pattern, the second crystalline phase contains AlN grains having highly fine wurtzite-type crystal structures, and thus, adhesion resistance of the hard coating when the hard coating is used in a cutting tool can be improved. In addition, when the value of P1/(P1+P2) is greater than or equal to 0.2 and less than or equal to 1, the hard coating can be a film in proper balance between high hardness and adhesion resistance.

(4) In a hard coating according to one aspect of the present invention, an indentation hardness of the hard coating determined by a nanoindentation method is preferably greater than or equal to 30 GPa. When an indentation hardness of the hard coating determined by a nanoindentation method is greater than or equal to 30 GPa, wear resistance of the hard coating improves, and especially when cutting work is performed on a cut-resistant material such as a heat-resistant alloy using a cutting tool provided with the hard coating, excellent performance can be provided.

(5) In a hard coating according to one aspect of the present invention, the absolute value of compressive residual stress of the $Al_{x2}Ti_{1-x2}N$ phase is preferably greater than or equal to 0.3 GPa and less than or equal to 3 GPa. When the absolute value of compressive residual stress of the $Al_{x2}Ti_{1-x2}N$ phase is greater than or equal to 0.3 GPa and less than or equal to 3 GPa, wear resistance of the hard coating can be made high, and thus, chipping resistance and fracture resistance can be improved.

(6) A cutting tool according to one aspect of the present invention is a cutting tool including a base member, and any of the hard coatings described above on the base member. Using such configuration, impact exerted on the two first crystalline phases during cutting can be alleviated by the second crystalline phase located between the two first crystalline phases, and thus life extension of a cutting tool can be achieved.

(7) A method for producing a hard coating according to one aspect of the present invention is a method for producing a hard coating including an ejection step of ejecting, onto a base member, each of a first gas containing halogenated titanium gas and halogenated aluminum gas, and a second gas containing ammonia gas, a first cooling step of cooling the base member to a temperature higher than or equal to 700° C. and lower than or equal to 750° C. at a cooling rate higher than 10° C./min, a maintenance step of maintaining the base member at a temperature higher than or equal to 700° C. and lower than or equal to 750° C., and a second cooling step of cooling the base member after the maintenance step, wherein a cooling rate for the base member in the second cooling step is lower than the cooling rate for the base member in the first cooling step. Using such configuration, impact exerted on the two first crystalline phases during cutting can be alleviated by the second crystalline phase located between the two first crystalline phases, and thus a cutting tool having a long life can be produced.

(8) In a method for producing a hard coating according to one aspect of the present invention, the base member is preferably maintained for a time period longer than or equal to 30 minutes and shorter than or equal to 300 minutes in the maintenance step. Using such configuration, the hard coating including the first crystalline phases and the second crystalline phase can be suitably formed.

(9) In a method for producing a hard coating according to one aspect of the present invention, the base member is preferably cooled to a temperature above 200° C. and lower than or equal to 400° C. at a cooling rate higher than or equal to 5° C./min and lower than or equal to 10° C./min in the second cooling step. Using such configuration, the hard coating including the first crystalline phases and the second crystalline phase can be suitably formed.

(10) In a method for producing a hard coating according to one aspect of the present invention, the first gas preferably further contains hydrogen chloride gas. In this case, there is a tendency that wear resistance of the hard coating can be improved.

DETAILS OF EMBODIMENT OF PRESENT INVENTION

An embodiment will be described below. Like reference symbols designate identical or corresponding portions throughout the drawings used for describing the embodiment.

<Cutting Tool>

FIG. 1 shows a schematic cross-sectional view of a cutting tool of the embodiment. As shown in FIG. 1, the cutting tool of the embodiment includes a base member 11, and a coating 50 provided on base member 11. Coating 50 includes a substrate film 20 and a hard coating 30 provided on substrate film 20.

<Hard Coating>

Figure 2:
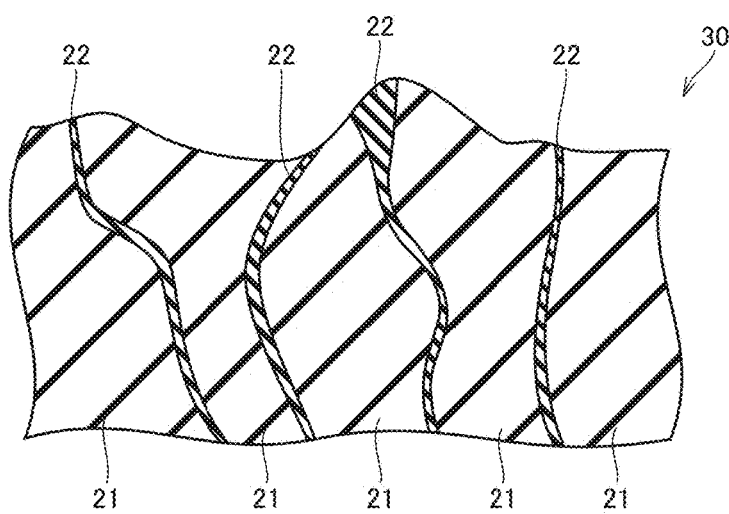
FIG. 2 is a schematic enlarged cross-sectional view of one example of the hard coating shown in FIG. 1.

FIG. 2 shows a schematic enlarged cross-sectional view of one example of hard coating 30 shown in FIG. 1. As shown in FIG. 2, hard coating 30 includes two first crystalline phases 21, and a second crystalline phase 22 disposed between two first crystalline phases 21 located next to each other. In this embodiment, at a boundary between first crystalline phase 21 and second crystalline phase 22, first crystalline phase 21 and second crystalline phase 22 may be completely separate from each other without including, in each phase, any atoms from the other phase; a portion of Ti atoms of first crystalline phase 21 may be included in second crystalline phase 22, or a portion of Al atoms of second crystalline phase 22 may be included in first crystalline phase 21. Note that it is sufficient for hard coating 30 to include at least two first crystalline phases 21, and hard coating 30 may thus include three or more first crystalline phases 21.

<First Crystalline Phases>

Figure 3:
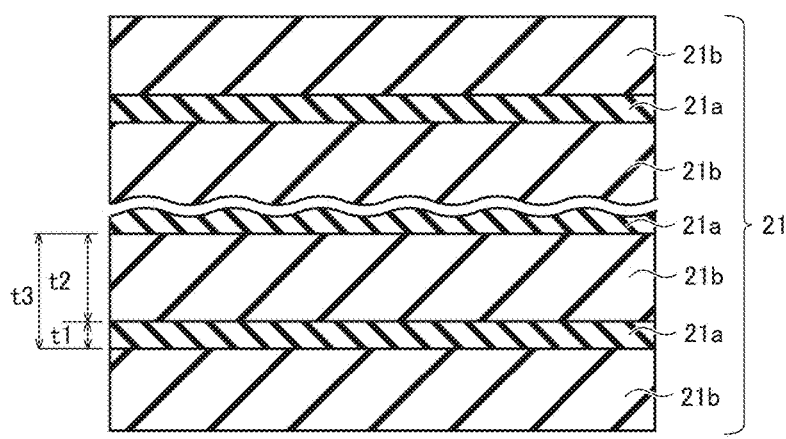
FIG. 3 is a schematic enlarged cross-sectional view of one example of one of the first crystalline phases shown in FIG. 2.

FIG. 3 shows a schematic enlarged cross-sectional view of one example of one of first crystalline phases 21 shown in FIG. 2. As shown in FIG. 3, first crystalline phase 21 includes a laminate structure having a $Ti_{1-x1}Al_{x1}N$ phase 21a having a sodium chloride (NaCl)-type crystal structure, and an $Al_{x2}Ti_{1-x2}N$ phase 21b having a NaCl-type crystal structure that are alternately stacked. Here, an Al composition ratio x1 of $Ti_{1-x1}Al_{x1}N$ phase 21a satisfies a relationship $0.5 \le x1 \le 0.75$, while an Al composition ratio x2 of the $Al_{x2}Ti_{1-x2}N$ phase satisfies a relationship $0.75 < x2 \le 0.95$. The laminate structure includes a region in which the Al concentration periodically changes along a stacking direction of the $Ti_{1-x1}Al_{x1}N$ phase and the $Al_{x2}Ti_{1-x2}N$ phase. In this region, the difference between a maximum value of Al composition ratio x2 and a minimum value of Al composition ratio x1 is greater than 0.25. Here, from a viewpoint of seeking life extension of a cutting tool, the difference between the maximum value of Al composition ratio x2 and the minimum value of Al composition ratio x1 in this region is preferably greater than 0.27, and more preferably greater than 0.3.

In this embodiment, at a boundary between $Ti_{1-x1}Al_{x1}N$ phase 21a and $Al_{x2}Ti_{1-x2}N$ phase 21b, $Ti_{1-x1}Al_{x1}N$ phase 21a and $Al_{x2}Ti_{1-x2}N$ phase 21b may be completely separate from each other without including, in each phase, any atoms from the other phase; a portion of atoms of $Ti_{1-x1}Al_{x1}N$ phase 21a may be included in $Al_{x2}Ti_{1-x2}N$ phase 21b; or a portion of atoms of $Al_{x2}Ti_{1-x2}N$ phase 21b may be included in $Ti_{1-x1}Al_{x1}N$ phase 21a.

In this regard, the Al concentration is a ratio of the number of Al atoms to the total number of atoms at one arbitrary point in the laminate structure of $Ti_{1-x1}Al_{x1}N$ phase 21a and $Al_{x2}Ti_{1-x2}N$ phase 21b, and can be determined by EDX or the like. The phrase "Al concentration periodically changes" means that, letting one period denote a continuous set of an increase and a decrease of an Al concentration in the stacking direction of the $Ti_{1-x1}Al_{x1}N$ phase and the $Al_{x2}Ti_{1-x2}N$ phase, the laminate structure of $Ti_{1-x1}Al_{x1}N$ phase 21a and $Al_{x2}Ti_{1-x2}N$ phase 21b includes at least two periods. In the stacking direction of $Ti_{1-x1}Al_{x1}N$ phase 21a and $Al_{x2}Ti_{1-x2}N$ phase 21b in the laminate structure of $Ti_{1-x1}Al_{x1}N$ phase 21a and $Al_{x2}Ti_{1-x2}N$ phase 21b, the Al concentration may periodically change, for example, sinusoidally or in other manner.

That $Ti_{1-x1}Al_{x1}N$ phase 21a and $Al_{x2}Ti_{1-x2}N$ phase 21b of first crystalline phase 21 each have a sodium chloride-type crystal structure can be verified by an observation using a TEM.

The composition (constituent elements and constituent ratio between constituent elements) of $Ti_{1-x1}Al_{x1}N$ phase 21a and $Al_{x2}Ti_{1-x2}N$ phase 21b of first crystalline phase 21 can be obtained by EDX or three-dimensional atom probe field ion microscopic analysis.

In first crystalline phases 21, a total thickness t3 of a per-phase thickness t1 of $Ti_{1-x1}Al_{x1}N$ phase 21a and a per-phase thickness t2 of $Al_{x2}Ti_{1-x2}N$ phase 21b located next to each other is preferably greater than or equal to 1 nm and less than or equal to 50 nm. When total thickness t3 is greater than or equal to 1 nm, production of hard coating 30 is easy. When total thickness t3 is less than or equal to 50 nm, strain relaxation at a boundary between $Ti_{1-x1}Al_{x1}N$ phase 21a and $Al_{x2}Ti_{1-x2}N$ phase 21b located next to each other, and reduction in wear resistance of hard coating 30 caused by phase transition of $Al_{x2}Ti_{1-x2}N$ phase 21b having a high Al composition ratio can be inhibited.

Although it is sufficient that, in first crystalline phases 21, the total thickness of at least one pair of one phase of $Ti_{1-x1}Al_{x1}N$ phase 21a and one phase of $Al_{x2}Ti_{1-x2}N$ phase 21b located next to each other is greater than or equal to 1 nm and less than or equal to 50 nm, the total thicknesses of all the pairs of one phase of $Ti_{1-x1}Al_{x1}N$ phase 21a and one phase of $Al_{x2}Ti_{1-x2}N$ phase 21b located next to each other are preferably greater than or equal to 1 nm and less than or equal to 50 nm from a viewpoint of stably producing hard coating 30 having excellent wear resistance.

The per-phase thickness t1 of $Ti_{1-x1}Al_{x1}N$ phase 21a and the per-phase thickness t2 of $Al_{x2}Ti_{1-x2}N$ phase 21b can each be determined by forming hard coating 30 on a surface of base member 11, and observing a cross section of hard coating 30 formed on the surface of base member 11 by high-angle annular dark-field scanning transmission electron microscopy (HAADF-STEM) using STEM.

<Second Crystalline Phase>

Second crystalline phase 22 contains AlN having a wurtzite-type crystal structure. As described above, AlN having a wurtzite-type crystal structure has a low hardness in general. However, in this embodiment, second crystalline phase 22 containing AlN having a wurtzite-type crystal structure functions to alleviate impact on first crystalline phases 21 that contribute to improvement of wear resistance of hard coating 30. This contributes to life extension of a cutting tool when hard coating 30 is used for the cutting tool.

Note that existence of second crystalline phase 22 can be verified by an observation using a TEM.

<Base Member>

Base member 11 may be, for example, tungsten carbide (WC) matrix cemented carbide, a cermet, high-speed steel, ceramic, a cubic boron nitride sintered body, a diamond sintered body, or the like, but is not necessarily limited thereto.

<Substrate Film>

Substrate film 20 can be one capable of improving adhesion between base member 11 and hard coating 30, and may be, for example, a titanium nitride (TiN) film, a titanium carbonitride (TiCN) film, or a laminate film of a TiN film and a TiCN film.

<Cutting Tool>

The cutting tool of the embodiment is not specifically limited as long as the cutting tool includes base member 11 and hard coating 30 on base member 11. Examples thereof include a drill, an end mill, an indexable cutting insert for drilling, an indexable cutting insert for end milling, an indexable cutting insert for milling, an indexable cutting insert for turning, a metal saw, a gear-cutting tool, a reamer, and a tap.

<Production Method>

Figure 4:
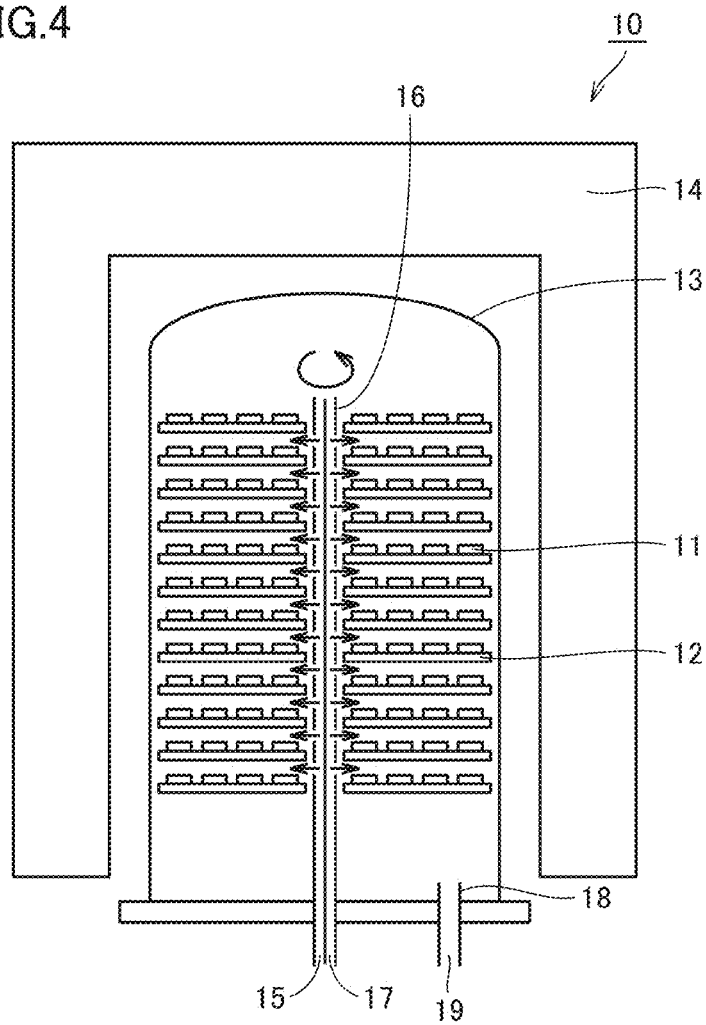
FIG. 4 is a schematic cross-sectional view of one example of a CVD apparatus for use in manufacturing the cutting tool of the embodiment.

FIG. 4 shows a schematic cross-sectional view of one example of a CVD apparatus for use in manufacturing a cutting tool of the embodiment. As shown in FIG. 4, a CVD apparatus 10 includes a plurality of base member setting fixtures 12 for placing base members 11, and a reaction vessel 13 made of heat-resistant alloy steel that covers base member setting fixtures 12. A temperature regulating device 14 for controlling the temperature inside reaction vessel 13 is provided around reaction vessel 13.

In reaction vessel 13, a gas introduction tube 16 having a first gas introduction tube 15 and a second gas introduction tube 17 joined together in an adjacent manner is rotatably provided extending in a vertical direction in the space inside reaction vessel 13. Gas introduction tube 16 is configured such that a gas introduced into first gas introduction tube 15 and a gas introduced into second gas introduction tube 17 will not mix with each other in gas introduction tube 16. In addition, a plurality of through holes are provided in portions of first gas introduction tube 15 and portions of second gas introduction tube 17 for ejecting gases flowing in first gas introduction tube 15 and second gas introduction tube 17 onto base members 11 placed in base member setting fixtures 12.

Reaction vessel 13 is also provided with a gas exhaust pipe 18 for exhausting a gas in reaction vessel 13 to the outside. The gas in reaction vessel 13 passes through gas exhaust pipe 18, and is then exhausted from a gas exhaust port 19 to the outside of reaction vessel 13.

Figure 5:
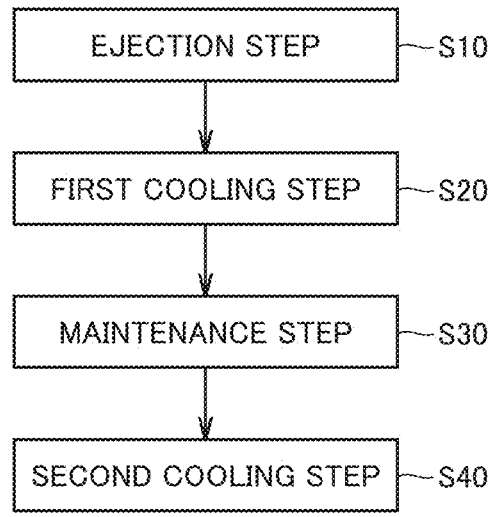
FIG. 5 is a flowchart of one example of a method for manufacturing the cutting tool of the embodiment.

FIG. 5 shows a flowchart of one example of a method for manufacturing a cutting tool of the embodiment. As shown in FIG. 5, a method for manufacturing a cutting tool of the embodiment includes an ejection step (S10), a first cooling step (S20), a maintenance step (S30), and a second cooling step (S40), and is performed in order of S10, S20, S30, and S40. Needless to say, the method for manufacturing a cutting tool of the embodiment may include a step or steps other than S10, S20, S30, and S40. Note that, for purposes of illustration, formation of hard coating 30 on base member 11 will be described below. However, it is needless to say that hard coating 30 may be formed after formation of other films such as substrate film 20 on base member 11.

<Ejection Step>

Ejection step (S10) is performed by ejecting a first gas containing halogenated titanium gas and halogenated aluminum gas, and a second gas containing ammonia ($NH_3$) gas, onto base member 11.

Ejection step (S10) can be performed, for example, in the following manner. First, the temperature in reaction vessel 13 is raised by temperature regulating device 14 to raise the temperature of base members 11 placed in base member setting fixtures 12 in reaction vessel 13 to, for example, a temperature of from 820° C. to 860° C. The pressure in reaction vessel 13 is, for example, from 1 kPa to 2.5 kPa.

Next, with gas introduction tube 16 being rotated about an axis, the first gas containing halogenated titanium gas and halogenated aluminum gas is introduced into gas introduction tube 15, and the second gas containing $NH_3$ gas is introduced into gas introduction tube 17. This permits the mixed gas having the first gas and the second gas being homogenized to be ejected toward the surfaces of the base members 11. As a result, the gas components contained in the first gas and the gas components contained in the second gas chemically react with one another on base members 11, and thus a melt containing Al, Ti, and N (hereinafter referred to as "$Al_yTi_{1-y}N$") is formed on base members 11 by a CVD method.

Here, the halogenated titanium gas may be, for example, titanium tetrachloride ($TiCl_4$) gas. The halogenated aluminum gas may be, for example, aluminum trichloride ($AlCl_3$) gas.

The first gas contains the halogenated titanium gas and the halogenated aluminum gas, and preferably further contains hydrogen chloride (HCl) gas. In this case, there is a tendency that wear resistance of hard coating 30 can be improved. Each of the first gas and the second gas may contain a carrier gas, such as, for example, nitrogen gas ($N_2$ gas) and/or hydrogen gas ($H_2$ gas).

<First Cooling Step>

After ejection step (S10), first cooling step (S20) is performed. First cooling step (S20) can be performed by, for example, regulating the set temperature of temperature regulating device 14 to cool base members 11 to a temperature higher than or equal to 700° C. and lower than or equal to 750° C. at a cooling rate higher than 10° C./min.

By ensuring the cooling rate for base members 11 of higher than 10° C./min, formation of AlN having a wurtzite-type crystal structure in first cooling step (S20) can be inhibited. From a viewpoint of inhibiting formation of AlN having a wurtzite-type crystal structure in first cooling step (S20), the cooling rate in first cooling step (S20) is preferably higher or equal to 15° C./min. In addition, the upper limit of the cooling rate for base members 11 in first cooling step (S20) is preferably lower than or equal to 30° C./min from a viewpoint of achieving tighter contact with hard coating 30.

By ensuring the ultimate temperature to which base members 11 are cooled in first cooling step (S20) of higher than or equal to 700° C. and lower than or equal to 750° C., first crystalline phases 21 each having an alternate laminate structure of $Ti_{1-x1}Al_{x1}N$ phase 21a and $Al_{x2}Ti_{1-x2}N$ phase 21b can be suitably formed in maintenance step (S30) described later herein. Note that if base members 11 are cooled to a temperature below 700° C. in first cooling step (S20), a zinc blende-type phase may be formed instead of $Al_{x2}Ti_{1-x2}N$ phase 21b in maintenance step (S30), whereas if base members 11 are cooled to a temperature above 750° C. in first cooling step (S20), since atoms are more active above 750° C., mixed crystals of first crystalline phases 21 and second crystalline phase 22 may be formed.

<Maintenance Step>

After first cooling step (S20), maintenance step (S30) is performed. Maintenance step (S30) can be performed by, for example, regulating the set temperature of temperature regulating device 14 to maintain base members 11 at a temperature higher than or equal to 700° C. and lower than or equal to 750° C. In maintenance step (S30), phase separation of $Al_yTi_{1-y}N$ permits first crystalline phases 21 each having an alternate laminate structure of $Ti_{1-x1}Al_{x1}N$ phase 21a and $Al_{x2}Ti_{1-x2}N$ phase 21b to be formed and grown.

The temperature maintenance time of base members 11 in maintenance step (S30) may be appropriately set according to a desired thickness of $Ti_{1-x1}Al_{x1}N$ phase 21a and a desired thickness of $Al_{x2}Ti_{1-x2}N$ phase 21b. However, this temperature maintenance time is preferably a time period longer than or equal to 30 minutes and shorter than or equal to 300 minutes. By ensuring a temperature maintenance time of base members 11 of longer than or equal to 30 minutes, $Ti_{1-x1}Al_{x1}N$ phase 21a and $Al_{x2}Ti_{1-x2}N$ phase 21b can be sufficiently grown to an extent that allows first crystalline phases 21 to function to a sufficient degree. There is a tendency that, by ensuring a temperature maintenance time of base members 11 of shorter than or equal to 300 minutes, $Ti_{1-x1}Al_{x1}N$ phase 21a and $Al_{x2}Ti_{1-x2}N$ phase 21b do not grow to an excessive degree, and second crystalline phase 22 containing AlN having a wurtzite-type crystal structure can be formed in second cooling step (S40) described later herein.

Note that, in this embodiment, the temperature of base members 11 in maintenance step (S30) does not necessarily need to be a completely constant temperature, but the temperature of base members 11 may vary in a range of higher than or equal to 700° C. and lower than or equal to 750° C.

<Second Cooling Step>

After maintenance step (S30), second cooling step (S40) is performed. Second cooling step (S40) can be performed by, for example, regulating the set temperature of temperature regulating device 14 to lower the temperature of base members 11.

The cooling rate for base members 11 in second cooling step (S40) can be a cooling rate that is lower than the cooling rate for base members 11 in first cooling step (S20), and which permits second crystalline phase 22 containing AlN having a wurtzite-type crystal structure to be formed in second cooling step (S40).

The cooling rate for base members 11 in second cooling step (S40) is preferably a cooling rate higher than or equal to 5° C./min and lower than or equal to 10° C./min from a viewpoint of inhibiting the reduction in hardness of hard coating 30.

In second cooling step (S40), the ultimate temperature to which base members 11 are cooled is preferably above 200° C. and lower than or equal to 400° C. When the ultimate temperature to which base members 11 are cooled is above 200° C. and lower than or equal to 400° C. in second cooling step (S40), second crystalline phase 22 containing AlN having a wurtzite-type crystal structure can be formed to a sufficient degree.

Figure 6:
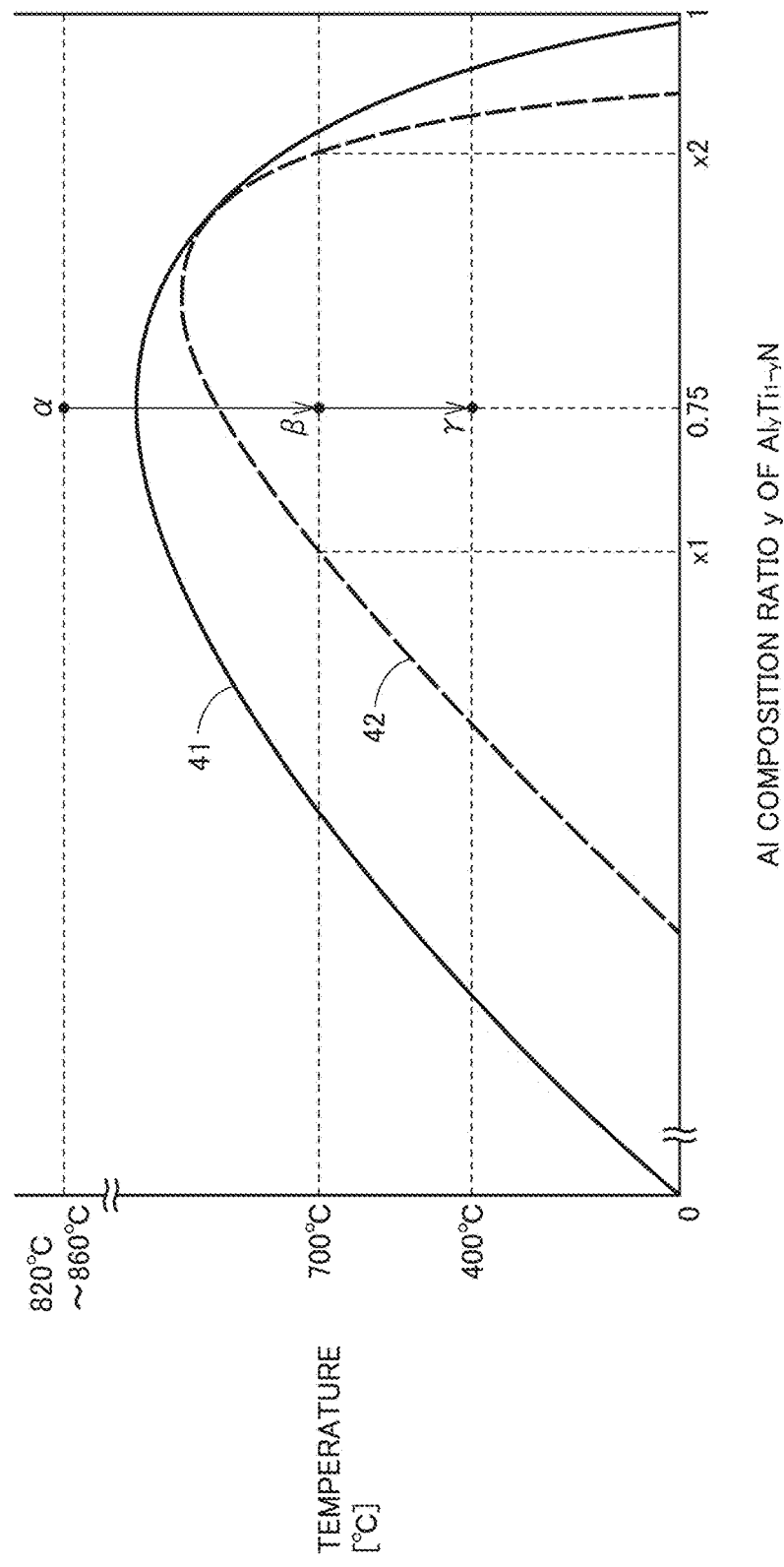
FIG. 6 is a diagram schematically illustrating one example of a binodal line and a spinodal line of $Al_yTi_{1-y}N$.

FIG. 6 schematically shows one example of a binodal line and a spinodal line of $Al_yTi_{1-y}N$. The horizontal axis of FIG. 6 represents the Al composition ratio y of $Al_yTi_{1-y}N$, with the value of the Al composition ratio y of $Al_yTi_{1-y}N$ increasing from left to right along the horizontal axis of FIG. 6. The vertical axis of FIG. 6 represents the temperature [° C.] of base members 11, with the temperature of base members 11 rising from bottom to top along the vertical axis of FIG. 6.

With reference to FIG. 6, one example of formation mechanism of the first crystalline phases and the second crystalline phase in ejection step (S10), first cooling step (S20), maintenance step (S30), and second cooling step (S40) will be inferred below.

First, a gas is prepared so that the Al composition ratio y of $Al_yTi_{1-y}N$ will be 0.75, and the gas is ejected onto the base members in ejection step (S10). This causes $Al_yTi_{1-y}N$ to be formed on the base members by a CVD method. The condition immediately after the formation of $Al_yTi_{1-y}N$ is represented at a point α of FIG. 6. At the point α of FIG. 6, the temperature of base members 11 is, for example, in a range of from 820° C. to 860° C.

Next, in first cooling step (S20), base members 11 are rapidly cooled at a cooling rate higher than 10° C./min to the ultimate temperature of base members 11 of 700° C. This condition is represented at a point β of FIG. 6. In first cooling step (S20), rapid cooling of base members 11 at a cooling rate higher than 10° C./min causes the temperature to be lowered, crossing a binodal line 41, down to the temperature at the point β (700° C.) below a spinodal line 42.

Here, a region under binodal line 41 represents the conditions in which AlN having a wurtzite-type crystal structure, which is a thermal equilibrium phase, is formed when cooling is performed at a low cooling rate. A region under spinodal line 42 represents the conditions in which $Ti_{1-x1}Al_{x1}N$ phase 21a and $Al_{x2}Ti_{1-x2}N$ phase 21b each having a NaCl-type crystal structure, which are non-thermal equilibrium phases, are formed by phase separation of $Al_yTi_{1-y}N$ when cooling is performed at a high cooling rate. Thus, in first cooling step (S20), formation of AlN having a wurtzite-type crystal structure can be inhibited, and the temperature of base members 11 can be directed to a temperature that permits $Ti_{1-x1}Al_{x1}N$ phase 21a and $Al_{x2}Ti_{1-x2}N$ phase 21b to be formed.

Next, in maintenance step (S30), the temperature of base members 11 is maintained at a temperature higher than or equal to 700° C. and lower than or equal to 750° C. In maintenance step (S30), phase separation of $Al_yTi_{1-y}N$ causes $Ti_{1-x1}Al_{x1}N$ phase 21a having a NaCl-type crystal structure and $Al_{x2}Ti_{1-x2}N$ phase 21b having a NaCl-type crystal structure to separate from each other, and thus first crystalline phases 21 including a structure with these phases alternately stacked is formed. In addition, the maintenance time of base members 11 in maintenance step (S30) determines the thickness of $Ti_{1-x1}Al_{x1}N$ phase 21a and the thickness of $Al_{x2}Ti_{1-x2}N$ phase 21b.

Next, in second cooling step (S40), base members 11 are slowly cooled to 400° C. at a cooling rate that is lower than the cooling rate in first cooling step (S20), and is higher than or equal to 5° C./min and lower than or equal to 10° C./min, which is sufficient for formation of AlN having a wurtzite-type crystal structure. The final condition of base members 11 in second cooling step (S40) is represented at a point γ of FIG. 6.

In second cooling step (S40), slow cooling of base members 11 results in formation of second crystalline phase 22 containing AlN having a wurtzite-type crystal structure.

As described above, hard coating 30 that includes first crystalline phases 21 including a structure having $Ti_{1-x1}Al_{x1}N$ phase 21a having a NaCl-type crystal structure and $Al_{x2}Ti_{1-x2}N$ phase 21b having a NaCl-type crystal structure that are alternately stacked, and second crystalline phase 22 containing AlN of a wurtzite-type crystal structure, is formed on base member 11, and thus a cutting tool of the embodiment is manufactured.

<Characteristics of Hard Coating>

<<TEM and XRD>>

Figure 7:
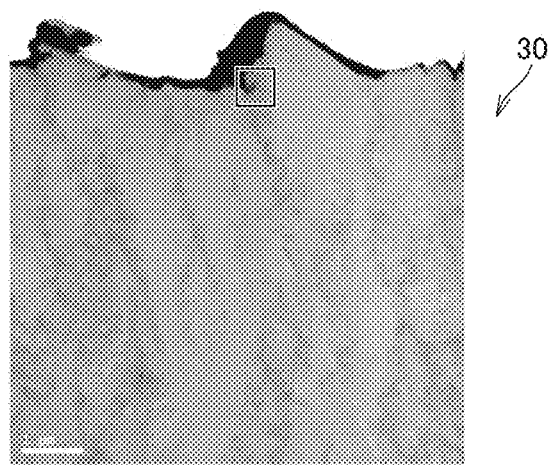
FIG. 7 is a transmission electron microscope (TEM) image of the hard coating of the cutting tool of the embodiment.
Figure 8:
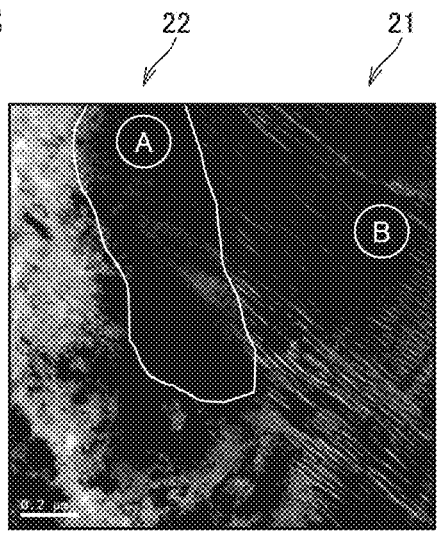
FIG. 8 is an enlarged TEM image of the area enclosed by the solid lines of FIG. 7.

FIG. 7 shows a TEM image of hard coating 30 of the cutting tool of the embodiment manufactured as described above. FIG. 8 shows an enlarged TEM image of the area enclosed by the solid lines of FIG. 7.

As shown in FIGS. 7 and 8, it has been verified that, in a certain region of hard coating 30, first crystalline phases 21 each having a structure having $Ti_{1-x1}Al_{x1}N$ phase 21a having a NaCl-type crystal structure and $Al_{x2}Ti_{1-x2}N$ phase 21b having a NaCl-type crystal structure that were alternately stacked were present, and second crystalline phase 22 containing AlN of a wurtzite-type crystal structure, disposed between two first crystalline phases 21, were present.

Figure 9:
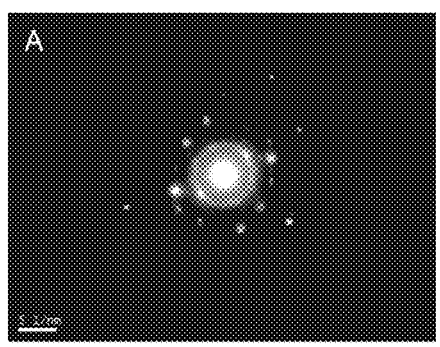
FIG. 9 is an electron diffraction image by a TEM of the region A of the second crystalline phase of FIG. 8.
Figure 10:
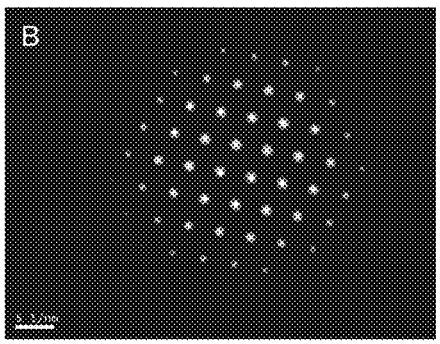
FIG. 10 is an electron diffraction image by a TEM of the region B of the first crystalline phase of FIG. 8.

FIG. 9 shows an electron diffraction image by a TEM of the region A of second crystalline phase 22 of FIG. 8. FIG. 10 shows an electron diffraction image by a TEM of the region B of first crystalline phase 21 of FIG. 8. While the electron diffraction image by a TEM of the region A of second crystalline phase 22 exhibits a concentric pattern as shown in FIG. 9, the electron diffraction image by a TEM of the region B of first crystalline phase 21 exhibits a dot pattern as shown in FIG. 10. This indicates that second crystalline phase 22 includes a plurality of crystal grains smaller than those of first crystalline phase 21.

In addition to the appearance of a concentric pattern in the electron diffraction image by a TEM of second crystalline phase 22, it is preferable that a ratio of a diffraction intensity P1 of a (200) plane of $Al_{x2}Ti_{1-x2}N$ phase 21b to a sum of the diffraction intensity P1 and a diffraction intensity P2 of a (100) plane of second crystalline phase 22 (i.e., P1/(P1+P2)) in an XRD pattern of hard coating 30 obtained by an XRD method be greater than or equal to 0.2 and less than or equal to 1. When an electron diffraction image by a TEM of second crystalline phase 22 exhibits a concentric pattern, second crystalline phase 22 contains AlN grains having highly fine wurtzite-type crystal structures, and thus, adhesion resistance of hard coating 30 when hard coating 30 is used in a cutting tool can be improved. In addition, when the value of P1/(P1+P2) is greater than or equal to 0.2 and less than or equal to 1, hard coating 30 can be a film in proper balance between high hardness and adhesion resistance. Here, from a viewpoint of seeking life extension of the cutting tool, the value of P1/(P1+P2) is more preferably less than or equal to 0.95, and still more preferably less than or equal to 0.9.

Figure 11:
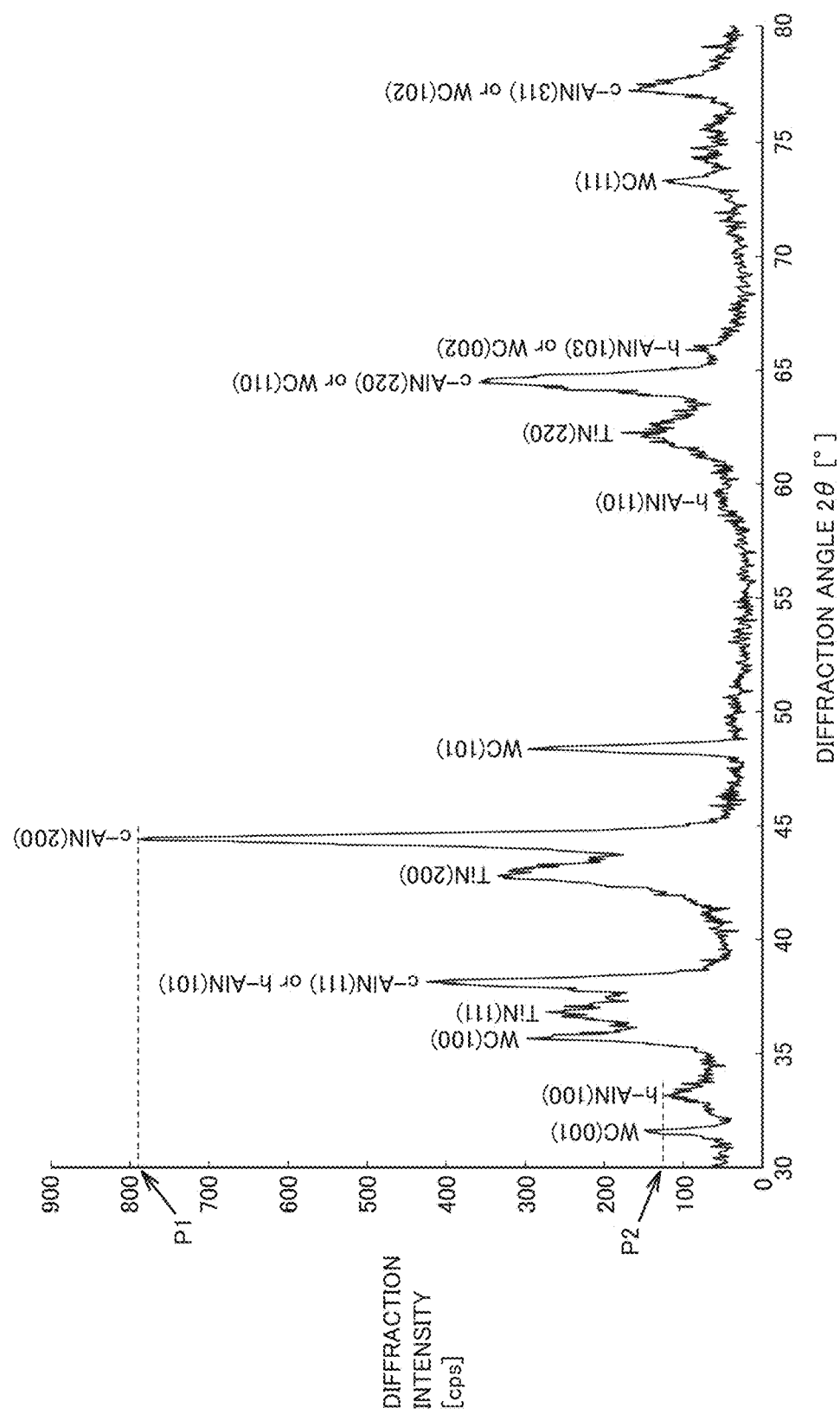
FIG. 11 is one example of an X-ray diffraction (XRD) pattern by an XRD method of the hard coating of the cutting tool of the embodiment.

FIG. 11 shows one example of an XRD pattern of hard coating 30 obtained by an XRD method. The horizontal axis of FIG. 11 represents the diffraction angle 2θ[°], and the vertical axis of FIG. 11 represents the diffraction intensity [cps: count per second]. In the XRD pattern shown in FIG. 11, the ratio P1/(P1+P2) of a diffraction intensity P1 of a (200) plane of $Al_{x2}Ti_{1-x2}N$ phase 21b to a sum of the diffraction intensity P1 and a diffraction intensity P2 of a (100) plane of second crystalline phase 22 is 0.87, which is in a range of greater than or equal to 0.2 and less than or equal to 1.

Note that the diffraction intensity P1 of a (200) plane of $Al_{x2}Ti_{1-x2}N$ phase 21b is the intensity at the diffraction peak observed at a 2θ in a range of greater than or equal to 43° and less than or equal to 45° along the horizontal axis of the XRD pattern of hard coating 30, and the diffraction intensity P2 of a (100) plane of second crystalline phase 22 is the intensity at the diffraction peak observed at a 20 in a range of greater than or equal to 32° and less than or equal to 35° along the horizontal axis of the XRD pattern of hard coating 30.

Figure 12:
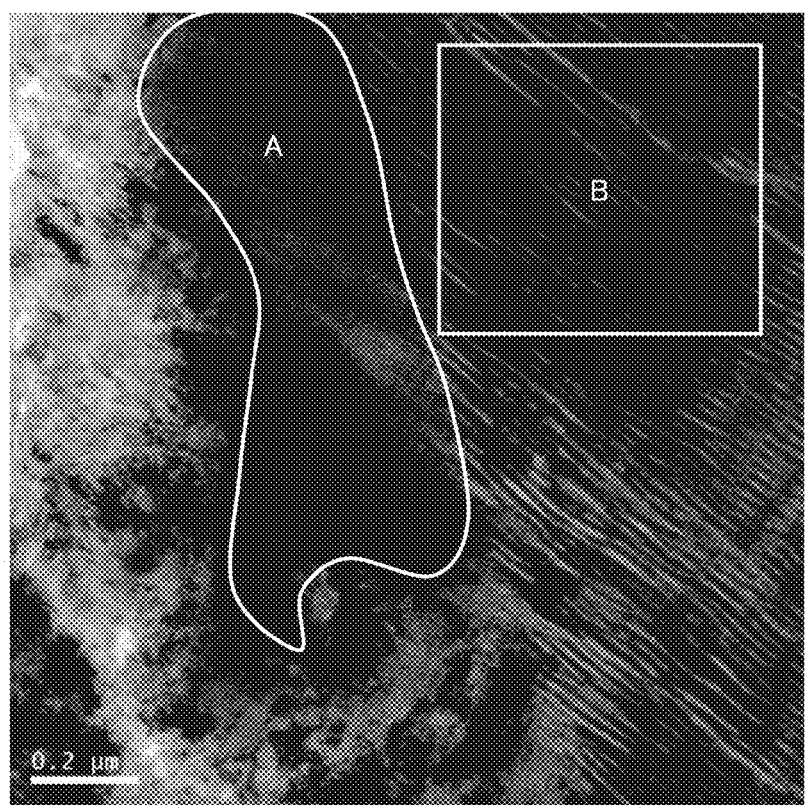
FIG. 12 is a TEM image of the hard coating of the cutting tool of the embodiment.
Figure 13:
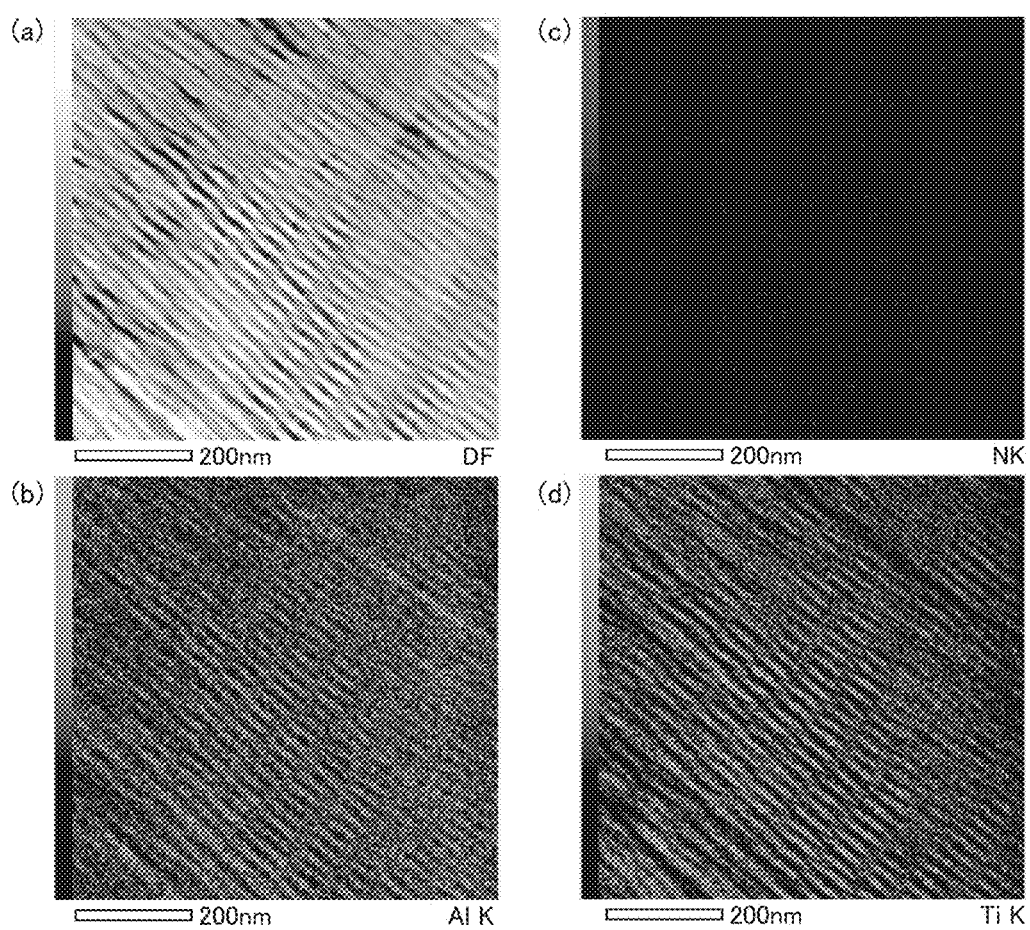
FIG. 13(a) is an energy-dispersive X-ray spectrometry (EDX) image of the region B of FIG. 12.
FIG. 13(b) shows a mapping result of the Al element of the region B of FIG. 12.
FIG. 13(c) shows a mapping result of the N element of the region B of FIG. 12.
FIG. 13(d) shows a mapping result of the Ti element of the region B of FIG. 12.

FIG. 12 shows a TEM image of hard coating 30 of the cutting tool of the embodiment manufactured as described above. FIG. 13(a) shows an EDX image of the region B of first crystalline phase 21 of FIG. 12; FIG. 13(b) shows a mapping result of the Al element in the region B of FIG. 12; FIG. 13(c) shows a mapping result of the N element in the region B of FIG. 12; and FIG. 13(d) shows a mapping result of the Ti element in the region B of FIG. 12.

Figure 14:
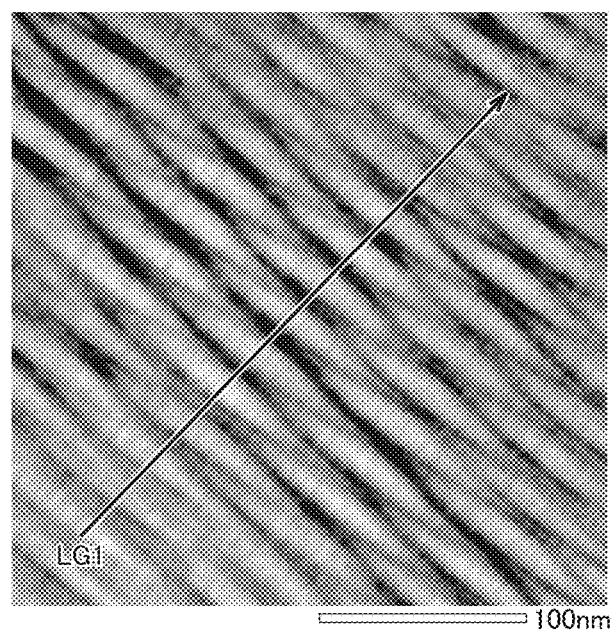
FIG. 14(a) is an enlarged image of FIG. 13(a)
FIG. 14(b) is a chart illustrating changes in an Al concentration, a N concentration, and a Ti concentration, respectively, along a stacking direction LG1 of the $Ti_{1-x1}Al_{x1}N$ phase and the $Al_{x2}Ti_{1-x2}N$ phase shown in FIG. 14(a).
Figure 14:
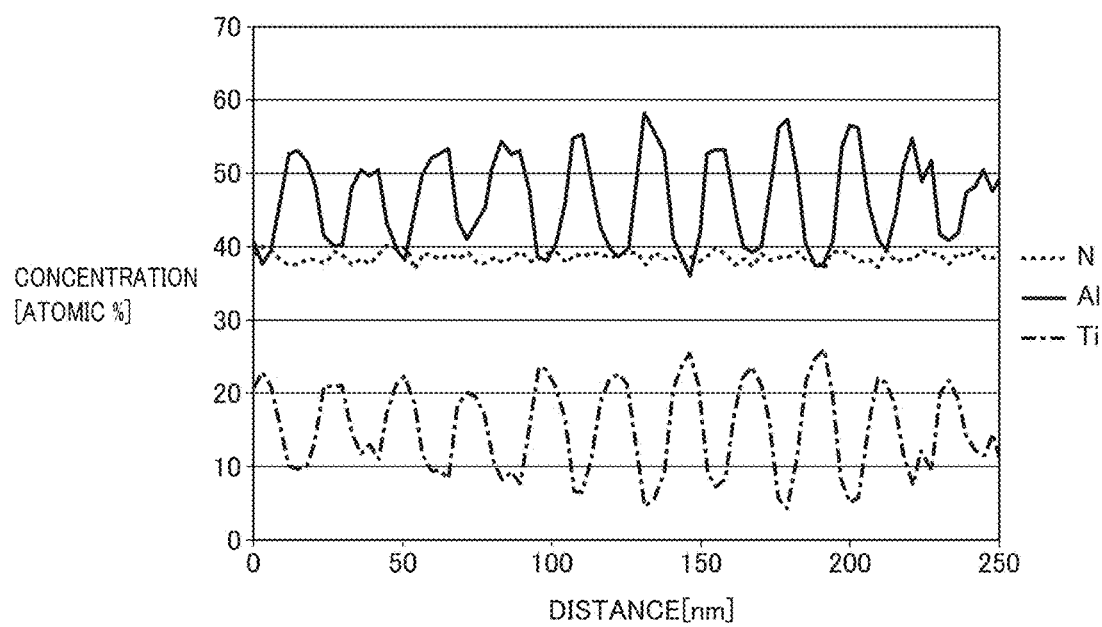

FIG. 14(a) shows an enlarged image of FIG. 13(a). FIG. 14(b) shows respective changes in an Al concentration, a N concentration, and a Ti concentration determined by EDX along a stacking direction LG1, shown in FIG. 14(a), of $Ti_{1-x1}Al_{x1}N$ phase 21a and $Al_{x2}Ti_{1-x2}N$ phase 21b. As shown in FIG. 14(b), it has been verified that, in the region B of first crystalline phase 21 of hard coating 30 of the cutting tool of the embodiment, the laminate structure of $Ti_{1-x1}Al_{x1}N$ phase 21a and $Al_{x2}Ti_{1-x2}N$ phase 21b includes a region in which an Al concentration periodically changes along a stacking direction of $Ti_{1-x1}Al_{x1}N$ phase 21a and $Al_{x2}Ti_{1-x2}N$ phase 21b. Note that the horizontal axis of FIG. 14(b) represents a distance [nm] from the measurement starting point in the stacking direction of $Ti_{1-x1}Al_{x1}N$ phase 21a and $Al_{x2}Ti_{1-x2}N$ phase 21b, and the vertical axis of FIG. 14(b) represents the respective concentrations [atomic %] of Al, N, and Ti.

Figure 15:
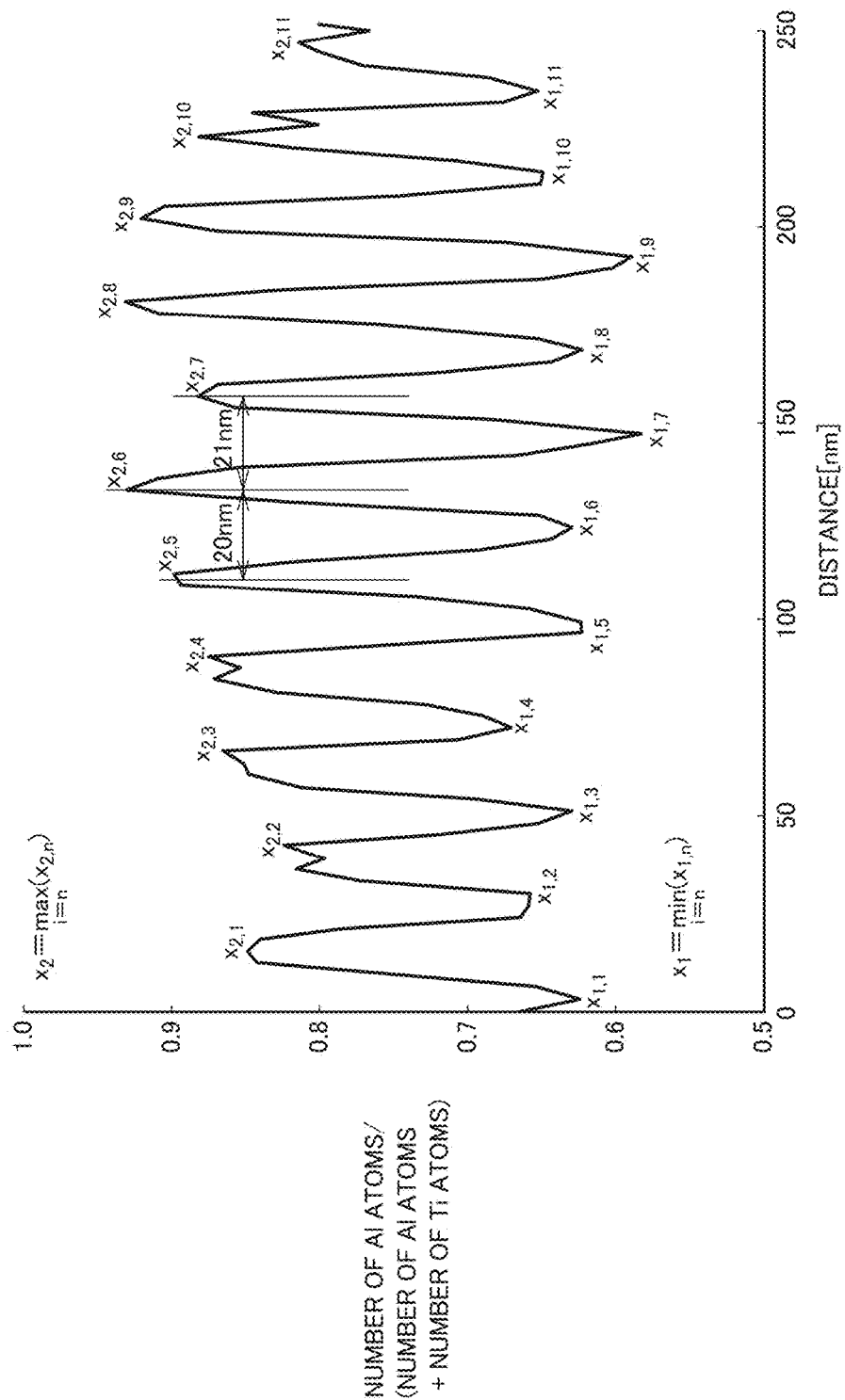
FIG. 15 is a chart illustrating a change in a ratio of the number of Al atoms to a sum of the number of Al atoms and the number of Ti atoms in the laminate structure of the $Ti_{1-x1}Al_{x1}N$ phase and the $Al_{x2}Ti_{1-x2}N$ phase along a stacking direction of the $Ti_{1-x1}Al_{x1}N$ phase and the $Al_{x2}Ti_{1-x2}N$ phase, calculated from FIGS. 14(a) to 14(d).

FIG. 15 shows a change in a ratio of the number of Al atoms to a sum of the number of Al atoms and the number of Ti atoms contained in the laminate structure of $Ti_{1-x1}Al_{x1}N$ phase 21a and $Al_{x2}Ti_{1-x2}N$ phase 21b along a stacking direction of $Ti_{1-x1}Al_{x1}N$ phase 21a and $Al_{x2}Ti_{1-x2}N$ phase 21b, calculated from the measurement result obtained by EDX of FIGS. 14(a) to 14(d). Note that the horizontal axis of FIG. 15 represents a distance [nm] from the measurement starting point in the stacking direction of $Ti_{1-x1}Al_{x1}N$ phase 21a and $Al_{x2}Ti_{1-x2}N$ phase 21b, and the vertical axis of FIG. 15 represents the ratio of the number of Al atoms to the sum of the number of Al atoms and the number of Ti atoms.

As shown in FIG. 15, it has been verified that a difference between the maximum value ($X_{2,6}$ in the example shown in FIG. 15) of Al composition ratio x2 of $Al_{x2}Ti_{1-x2}N$ phase 21b and the minimum value ($X_{1,7}$) of Al composition ratio x1 of $Ti_{1-x1}Al_{x1}N$ phase 21a in the laminate structure of $Ti_{1-x1}Al_{x1}N$ phase 21a and $Al_{x2}Ti_{1-x2}N$ phase 21b of the hard coating of the embodiment, along the stacking direction of $Ti_{1-x1}Al_{x1}N$ phase 21a and $Al_{x2}Ti_{1-x2}N$ phase 21b, is greater than 0.25. In addition, as shown in FIG. 15, the distances between $Al_{x2}Ti_{1-x2}N$ phase 21b having the maximum value ($X_{2,6}$ in the example shown in FIG. 15) of Al composition ratio x2 and $Al_{x2}Ti_{1-x2}N$ phases 21b located next thereto are, respectively, 20 nm and 21 nm.

<<Indentation Hardness>>

An indentation hardness of hard coating 30 determined by a nanoindentation method is preferably greater than or equal to 30 GPa. When an indentation hardness of hard coating 30 determined by a nanoindentation method is greater than or equal to 30 GPa, wear resistance of hard coating 30 improves, and especially when cutting work is performed on a cut-resistant material, such as a heat-resistant alloy, with a cutting tool provided with hard coating 30, excellent performance can be provided.

The indentation hardness of hard coating 30 determined by a nanoindentation method can be calculated by dividing a load when an indenter is forced into hard coating 30 in a direction perpendicular to the thickness direction at a predetermined load (e.g., 25 mN) using a nanoindentation hardness tester capable of being used for a nanoindentation method (e.g., one manufactured by ELIONIX Inc.) by the contact area between an indenter and hard coating 30.

<<Compressive Residual Stress>>

The absolute value of compressive residual stress of $Al_{x2}Ti_{1-x2}N$ phase 21b is preferably greater than or equal to 0.3 GPa and less than or equal to 3 GPa. When the absolute value of compressive residual stress of $Al_{x2}Ti_{1-x2}N$ phase 21b is greater than or equal to 0.3 GPa and less than or equal to 3 GPa, wear resistance of hard coating 30 can be made high, and thus, chipping resistance and fracture resistance can be improved. The compressive residual stress of $Al_{x2}Ti_{1-x2}N$ phase 21b can be made greater than or equal to 0.3 GPa and less than or equal to 3 GPa by making an adjustment to a total thickness t3, which is a sum of a per-phase thickness t1 of $Ti_{1-x1}Al_{x1}N$ phase 21a and a per-phase thickness t2 of $Al_{x2}Ti_{1-x2}N$ phase 21b located next to each other.

As used herein, the term "compressive residual stress" is a sort of internal stress (intrinsic stress) present in $Al_{x2}Ti_{1-x2}N$ phase 21b, and refers to stress represented by a negative (−) value (unit: "GPa" is used in the embodiment). This means that a concept of large compressive residual stress indicates a large absolute value of the value described above, while a concept of small compressive residual stress indicates a small absolute value of the value described above.

The compressive residual stress of $Al_{x2}Ti_{1-x2}N$ phase 21b can be determined by a $sin^2\varnothing$ method using an X-ray stress measurement apparatus. Such $sin^2\varnothing$ method using an X-ray is widely used as a method for measuring residual stress in a polycrystalline material. For example, a method can be used which is described in detail on pages 54 to 67 of "X-sen Ouryoku Sokutei Hou" (X-ray stress measurement method) (the Society of Materials Science, Japan, published by Yokendo Co., Ltd. in 1981).

<<Impurities>>

Hard coating 30 may or may not contain at least one impurity selected from the group consisting of chlorine (Cl), oxygen (O), and carbon (C).

<<Entire Thickness of Hard Coating>>

An entire thickness T1 of hard coating 30 shown in FIG. 1 is preferably greater than or equal to 1 µm and less than or equal to 20 µm. When the entire thickness T1 of hard coating 30 is greater than or equal to 1 µm, the characteristics of hard coating 30 tend to significantly improve. When the entire thickness T1 of hard coating 30 is less than or equal to 20 µm, the improvement in the characteristics of hard coating 30 tends to exhibit a significant change. From a viewpoint of improving the characteristics of hard coating 30, the entire thickness T1 of hard coating 30 is more preferably greater than or equal to 2 µm and less than or equal to 15 µm, and still more preferably greater than or equal to 3 µm and less than or equal to 10 µm.

<Coating>

Coating 50 may include films other than hard coating 30. The films other than hard coating 30 included in coating 50 may include, in addition to substrate film 20 described above, for example, a film formed of a compound of at least one selected from the group consisting of Ti, Zr, and Hf and at least one selected from the group consisting of N, O, C, B, CN, BN, CO, and NO. Coating 50 may also include at least one of an $\alpha$-$Al_2O_3$ film and a $\kappa$-$Al_2O_3$ film as an oxidation resistant film. For example, coating 50 may include a film other than hard coating 30 as the outermost film at the top surface. However, coating 50 does not have to include substrate film 20.

An entire thickness T2 of coating 50 is preferably greater than or equal to 3 µm and less than or equal to 30 µm. When entire thickness T2 of coating 50 is greater than or equal to 3 µm, the characteristics of coating 50 tend to be suitably exerted. When the entire thickness T2 of coating 50 is less than or equal to 30 µm, peeling of coating 50 during cutting work tends to be preventable. From a viewpoint of allowing the characteristics of coating 50 to be suitably exerted, and preventing peeling of coating 50 during cutting, the entire thickness T2 of coating 50 is more preferably greater than or equal to 5 µm and less than or equal to 20 µm, and still more preferably greater than or equal to 7 µm and less than or equal to 15 µm.

<Functions and Advantages>

Hard coating 30 of the embodiment includes at least two first crystalline phases 21 of a laminate structure having $Ti_{1-x1}Al_{x1}N$ ($0.5 \leq x1 \leq 0.75$) phase 21a having a NaCl-type crystal structure and $Al_{x2}Ti_{1-x2}N$ ($0.75 < x2 \leq 0.95$) phase 21b having a NaCl-type crystal structure. The laminate structure includes a region in which the Al concentration periodically changes in the stacking direction of $Ti_{1-x1}Al_{x1}N$ phase 21a and $Al_{x2}Ti_{1-x2}N$ phase 21b. In this region, a difference between the maximum value of the Al composition ratio x2 and the minimum value of the Al composition ratio x1 is greater than 0.25. In addition, this laminate structure includes second crystalline phase 22 containing AlN having a wurtzite-type crystal structure disposed between two first crystalline phases 21.

As described above, $Ti_{1-x1}Al_{x1}N$ phase 21a and $Al_{x2}Ti_{1-x2}N$ phase 21b included in first crystalline phases 21 both have cubic systems that provide excellent hardness; the laminate structure of $Ti_{1-x1}Al_{x1}N$ phase 21a and $Al_{x2}Ti_{1-x2}N$ phase 21b being alternately stacked includes a region in which the Al concentration periodically changes in the stacking direction of $Ti_{1-x1}Al_{x1}N$ phase 21a and $Al_{x2}Ti_{1-x2}N$ phase 21b; and in this region, a difference between the maximum value of the Al composition ratio x2 and the minimum value of the Al composition ratio x1 is greater than 0.25. These features permit hard coating 30 to exhibit excellent wear resistance. In addition, due to the presence of second crystalline phase 22 containing AlN having a wurtzite-type crystal structure that exhibits low hardness between two first crystalline phases 21, impact exerted on two first crystalline phases 21 during cutting can be alleviated by second crystalline phase 22 located between two first crystalline phases 21. Thus, life extension of a cutting tool can be achieved for the cutting tool having hard coating 30 of the embodiment.

In addition, hard coating 30 of the embodiment is formed only by forming $Al_yTi_{1-y}N$ on the base member in ejection step (S10), cooling base member 11 to a temperature higher than or equal to 700° C. and lower than or equal to 750° C. at a cooling rate higher than 10° C./min in first cooling step (S20), followed by maintaining the base member at a temperature higher than or equal to 700° C. and lower than or equal to 750° C. in maintenance step (S30) to form the first crystalline phases, and then cooling the base member at a cooling rate lower than that of first cooling step (S20) in second cooling step (S40). It is believed that even the idea of using such two cooling steps having different cooling rates for forming a hard coating is not obvious to those skilled in the art. That is to say, from a viewpoint of manufacturing efficiency, a hard coating is usually manufactured by using only one cooling step, for example, as described in PTD 2. It is also believed that the two cooling steps of the embodiment result in formation of a structure including second crystalline phase 22 having low hardness between two first crystalline phases 21 having high hardness, and the fact that this structure leads to life extension of the cutting tool, are far from obvious to those skilled in the art.

EXAMPLES

The thickness of each film of a coating presented below is determined by observing a cross section of the coating by high-angle annular dark-field scanning STEM using STEM. The composition of each film of the coating presented below is obtained by three-dimensional atom probe field ion microscopic analysis. The existence of the first crystalline phases and the second crystalline phase in the hard coating described below is verified by an observation using a TEM. The minimum value of Al composition ratio x1 of the $Ti_{1-x1}Al_{x1}N$ phase and the maximum value of Al composition ratio x2 of the $Al_{x2}Ti_{1-x2}N$ phase presented below are calculated by EDX. A value of ((maximum value of x2)−(minimum value of x1)) presented below is calculated by obtaining the difference between the maximum value of Al composition ratio x2 of the $Al_{x2}Ti_{1-x2}N$ phase and the minimum value of Al composition ratio x1 of $Ti_{1-x1}Al_{x1}N$ phase. An average total thickness, presented below, of the $Ti_{1-x1}Al_{x1}N$ phases and the $Al_{x2}Ti_{1-x2}N$ phases located next to each other in the hard coating is calculated by first obtaining the per-phase thicknesses of the $Ti_{1-x1}Al_{x1}N$ phases and the per-phase thicknesses of the $Al_{x2}Ti_{1-x2}N$ phases located next to each other through observation using a TEM, and then calculating the average value of the total thicknesses thereof. An electron diffraction image pattern presented below is an electron diffraction image pattern obtained from an electron diffraction image using a TEM of the second crystalline phase of the hard coating. A value of P1/(P1+P2) presented below is calculated from a diffraction intensity P1 of a (200) plane of the $Al_{x2}Ti_{1-x2}N$ phase and a diffraction intensity P2 of a (100) plane of the second crystalline phase in an XRD pattern of the hard coating. A hardness of the hard coating presented below is an indentation hardness (Hv) of the hard coating determined by a nanoindentation method using a nanoindentation hardness tester manufactured by ELIONIX Inc. The absolute values of compressive residual stress of the $Al_{x2}Ti_{1-x2}N$ phase presented below are calculated by a $sin^2\phi$ method using an X-ray stress measurement apparatus.

<Production of Cutting Tool>
<<Preparation of Base Member>>

First, base members K and base members L shown in Table 1 below are prepared as the base members for forming the coatings. Specifically, raw material powders having the blend compositions (% by mass) presented in Table 1 are mixed uniformly. The term "remainder" in Table 1 indicates that WC accounts for the rest of the blend composition (% by mass). Next, this powder mixture is pressure formed into a predetermined shape, followed by sintering at a temperature of from 1300° C. to 1500° C. for one to two hours to obtain base members K (base member model: CNMG120408NUX) and base members L (base member model: SEET13T3AGSN-G) both formed of cemented carbide.

The two base member models CNMG120408NUX and SEET13T3AGSN-G are products of Sumitomo Electric Hardmetal Corp. CNMG120408NUX is a model of indexable cutting insert for turning, and SEET13T3AGSN-G is a model of indexable cutting insert for rotary cutting (milling).

TABLE 1

| Type | | Blend composition (% by mass) | | | | | |
|---|---|---|---|---|---|---|---|
| | | Co | VC | $Cr_3C_2$ | NbC | TaC | WC |
| Base member | K | 5.0 | 0.2 | 0.3 | 0 | 0 | remainder |
| | L | 10.0 | 0 | 0 | 0.1 | 2.0 | remainder |

<<Production of Coating: Samples Nos. 1 to 18>>

By forming a substrate film, a hard coating, and an outermost film as shown in the "coating configuration" column of Table 2 on the surface of base member K or base member L, a coating is formed on the surface of base member K or base member L to produce cutting tools (samples Nos. 1 to 18). The cutting tools of samples Nos. 1 to 14 are examples, and the cutting tools of samples Nos. 15 to 18 are comparative examples.

TABLE 2

| | | Coating configuration | | | |
|---|---|---|---|---|---|
| Sample No. | Base member type | Substrate film (μm) | Hard coating (μm) | Outermost film (μm) | Thickness of entire coating (μm) |
| 1 | K | TiN(0.5)—TiCN(2.5) | a (6.0) | — | 9.0 |
| 2 | K | TiN(0.5)—TiCN(2.5) | b (5.0) | — | 8.0 |
| 3 | K | TiN(0.5)—TiCN(2.5) | c (6.0) | — | 9.0 |
| 4 | K | TiN(0.5)—TiCN(2.5) | d (5.5) | — | 8.5 |
| 5 | K | TiN(1.0) | e (9.0) | — | 10.0 |
| 6 | K | TiN(1.0) | a (10.0) | TiBNO(0.3)—$Al_2O_3$(1.0) | 12.3 |
| 7 | K | TiN(1.0) | b (9.5) | TiCNO(0.3)—$Al_2O_3$(1.0) | 11.8 |
| 8 | L | TiN(0.5)—TiCN(2.5) | c (4.0) | — | 7.0 |
| 9 | L | TiN(0.5)—TiCN(2.5) | d (5.0) | — | 8.0 |
| 10 | L | TiN(0.5)—TiCN(2.5) | e (5.5) | — | 8.5 |
| 11 | L | TiN(1.0) | f (4.5) | — | 5.5 |
| 12 | L | TiN(1.0) | g (5.0) | — | 6.0 |
| 13 | L | TiN(1.0) | f (3.0) | TiBNO(0.3)—$Al_2O_3$(1.0) | 5.3 |
| 14 | L | TiN(1.0) | g (4.0) | TiCNO(0.3)—$Al_2O_3$(1.0) | 6.3 |
| 15 | K | TiN(0.5)—TiCN(2.5) | h (6.0) | — | 9.0 |
| 16 | K | TiN(1.0) | i (10.0) | TiCNO(0.3)—$Al_2O_3$(1.0) | 12.3 |
| 17 | L | TiN(1.0) | h (4.0) | — | 5.0 |
| 18 | L | TiN(1.0) | i (4.0) | TiCNO(0.3)—$Al_2O_3$(1.0) | 6.3 |

In Table 2, a substrate film is a film in direct contact with the base member; a hard coating is a film formed on the substrate film; and an outermost film is a film formed on the hard coating, and exposed to the outside. The description of compounds of Table 2 represents the compounds that form the substrate film, hard coating, and outermost film of Table 2, and a number in parentheses right to a compound name refers to the thickness of the film. When two compounds are shown in one cell of Table 2 (e.g., "TiN(0.5)-TiCN(2.5)"), the compound on the left ("TiN(0.5)") refers to the film proximate to the surface of the base member, while the compound on the right ("TiCN(2.5)") refers to the film distant from the surface of the base member. The numbers in parentheses refer to the thicknesses of the respective films. Cells with symbols "-" of Table 2 indicate that such films are not present.

For example, the cutting tool of sample No. 1 in Table 2 refers to a cutting tool that has a coating including a TiN film having a thickness of 0.5 μm and a TiCN film having a thickness of 2.5 μm that are sequentially stacked on the surface of base member K to form a substrate film; a hard coating having a thickness of 6.0 μm formed on the substrate film under a formation condition set a described later herein;

and no outermost film formed on the hard coating. In addition, this cutting tool has a thickness of the entire coating of 9.0 μm.

The substrate films and the outermost films shown in Table 2 are films formed by a conventionally known CVD method. The formation condition sets are shown in Table 3. For example, the row of "TiN (substrate film)" of Table 3 shows the formation condition set of the TiN film as the substrate film. The description on the TiN film (substrate film) of Table 3 indicates that a base member is placed in a reaction vessel of the CVD apparatus (environment in the reaction vessel: 6.7 kPa and 915° C.), and a mixed gas consisting of 2% by volume of $TiCl_4$ gas, 39.7% by volume of $N_2$ gas, and the remaining 58.3% by volume of $H_2$ gas is ejected into the reaction vessel having an atmosphere at a pressure of 6.7 kPa and a temperature of 915° C. at a flow rate of 44.7 L/min. The thickness of each film formed under each formation condition set is controlled by the time period during which each reactant gas is ejected.

TABLE 3

| Type | Formation condition set Gas composition (% by volume) | Reaction atmosphere Pressure (kPa) | Temperature (° C.) | Total gas amount (L/min) |
|---|---|---|---|---|
| TiN | $TiCl_4$ = 2.0%, $N_2$ = 39.7%, $H_2$ = remainder | 6.7 | 915 | 44.7 |
| TiCN | $TiCl_4$ = 2.0%, $CH_3CN$ = 0.7%, $H_2$ = remainder | 9 | 860 | 35.4 |
| TiBNO | $TiCl_4$ = 36.7%, $BCl_3$ = 0.1%, CO = 1.6%, $CO_2$ = 1.7%, $N_2$ = 61.7%, $H_2$ = remainder | 6.7 | 980 | 56.2 |
| TiCNO | $TiCl_4$ = 2.1%, CO = 3.2%, $CH_4$ = 2.8%, $N_2$ = 23.7%, $H_2$ = remainder | 16.0 | 1030 | 49.4 |
| $Al_2O_3$ | $AlCl_3$ = 1.6%, $CO_2$ = 4.5%, $H_2S$ = 0.2%, HCl = 3.5%, $H_2$ = remainder | 6.7 | 1000 | 32.3 |

The hard coatings shown in Table 2 are produced using CVD apparatus 10 shown in FIG. 4 under one of formation condition sets a to i shown in Tables 4 and 5. For example, the description of formation condition set a in Tables 4 and 5 represents the formation of a hard coating as follows.

First, $Al_yTi_{1-y}N$ is formed on the base member under the conditions of the base member temperature (820° C.), the pressure in reaction vessel (1.5 kPa), the total gas flow rate (50 L/min), and the gas composition ($TiCl_4$: 0.2% by volume, $AlCl_3$: 0.7% by volume, $NH_3$: 2.8% by volume, HCl: 0.3% by volume, $N_2$: 35.4% by volume, and $H_2$: remainder) as shown in row a of Table 4, followed by performing the first cooling step of cooling the base member to 750° C. at a cooling rate of 15° C./min shown in Table 5. Thereafter, the maintenance step of maintaining the base member at 750° C. for 90 minutes is performed, and then the second cooling step of cooling the base member to 400° C. at a cooling rate of 8° C./min is performed.

The hard coatings of samples Nos. 1 to 14 shown in Table 2 formed as described above each include at least two first crystalline phases of a laminate structure having a $Ti_{1-x1}Al_{x1}N$ (0.5≤x1≤0.75) phase having a NaCl-type crystal structure and an $Al_{x2}Ti_{1-x2}N$ (0.75<x2≤0.95) phase having a NaCl-type crystal structure that are alternately stacked, and a second crystalline phase containing AlN having a wurtzite-type crystal structure disposed between the two first crystalline phases. In each of the hard coatings of samples Nos. 1 to 14 shown in Table 2, the laminate structure includes a region in which the Al concentration periodically changes along the stacking direction of $Ti_{1-x1}Al_{x1}N$ phase and $Al_{x2}Ti_{1-x2}N$ phase; and in this region, a difference between the maximum value of the Al composition ratio x2 and the minimum value of the Al composition ratio x1 is greater than 0.25. Note that Table 6 shows the minimum values of Al composition ratio x1 of the $Ti_{1-x1}Al_{x1}N$ (0.5≤x1≤0.75) phases and the maximum values of Al composition ratio x2 of the $Al_{x2}Ti_{1-x2}N$ (0.75<x2≤0.95) phases in the hard coatings of samples Nos. 1 to 14.

The description of formation condition set h in Tables 4 and 5 represents formation of a hard coating in the following manner.

First, $Al_yTi_{1-y}N$ is formed on the base member under the conditions of the base member temperature (800° C.), the pressure in reaction vessel (3 kPa), the total gas flow rate (60 L/min), and the gas composition ($TiCl_4$: 0.15% by volume, $AlCl_3$: 0.9% by volume, $NH_3$: 3.3% by volume, HCl: 0% by volume, $N_2$: 40% by volume, and $H_2$: remainder) as shown in row h of Table 4. Thereafter, the base member is cooled to 400° C. at a cooling rate of 3.5° C./min shown in Table 5.

In the hard coatings of samples Nos. 15 and 17 shown in Table 2 formed as described above, $Ti_{1-x1}Al_{x1}N$ (0.5≤x1≤0.75) phases each having a NaCl-type crystal structure are not formed, but $Al_{x2}Ti_{1-x2}N$ (0.75<x2≤0.95) phases each having a NaCl-type crystal structure, and second crystalline phases each containing AlN having a wurtzite-type crystal structure are formed. Note that Table 6 shows a value of 0.85 as the maximum value of Al composition ratio x2 of the $Al_{x2}Ti_{1-x2}N$ (0.5<x2≤0.95) phases of the hard coatings of samples Nos. 15 and 17.

The description of formation condition set i in Tables 4 and 5 represents formation of a hard coating in the following manner.

First, $Al_yTi_{1-y}N$ is formed on the base member under the conditions of the base member temperature (800° C.), the pressure in reaction vessel (1 kPa), the total gas flow rate (60 L/min), and the gas composition ($TiCl_4$: 0.25% by volume, $AlCl_3$: 0.65% by volume, $NH_3$: 2.7% by volume, HCl: 0% by volume, $N_2$: 40% by volume, and $H_2$: remainder) as shown in row i of Table 4. Thereafter, the base member is cooled to 400° C. at a cooling rate of 10° C./min shown in Table 5.

In the hard coatings of samples Nos. 16 and 18 shown in Table 2 formed as described above, only the first crystalline phases each including a structure having a $Ti_{1-x1}Al_{x1}N$ (0.1≤x1≤0.5) phase having a NaCl-type crystal structure and an $Al_{x2}Ti_{1-x2}N$ (0.5<x2≤0.95) phase having a NaCl-type crystal structure that are alternately stacked are formed, and second crystalline phases each containing AlN having a wurtzite-type crystal structure are not formed. Note that Table 6 shows a value of 0.25 as the minimum value of Al composition ratio x1 of the $Ti_{1-x1}Al_{x1}N$ (0.1≤x1≤0.5) phases and a value of 0.95 as the maximum value of Al composition ratio x2 of the $Al_{x2}Ti_{1-x2}N$ (0.5<x2≤0.95) phases, of the hard coatings of samples Nos. 16 and 18.

Table 6 shows properties of the hard coatings formed under the formation condition sets a to i of Table 4.

TABLE 4

| Formation condition set | Base member temperature (° C.) | Pressure in reaction vessel (kPa) | Total gas flow rate (L/min) | Gas composition (% by volume) | | | | | | AlCl₃/TiCl₄ Volume ratio |
|---|---|---|---|---|---|---|---|---|---|---|
| | | | | TiCl₄ | AlCl₃ | NH₃ | HCl | N₂ | H₂ | |
| a | 820 | 1.5 | 50 | 0.20 | 0.70 | 2.8 | 0.30 | 35.4 | remainder | 3.5 |
| b | 820 | 1.5 | 55 | 0.15 | 0.90 | 3.3 | 0.35 | 35.4 | remainder | 6.0 |
| c | 850 | 2.0 | 60 | 0.30 | 0.60 | 2.7 | 0.25 | 35.4 | remainder | 2.0 |
| d | 850 | 2.0 | 60 | 0.30 | 0.60 | 2.7 | 0.25 | 35.4 | remainder | 2.0 |
| e | 850 | 2.0 | 60 | 0.30 | 0.60 | 2.7 | 0.25 | 35.4 | remainder | 2.0 |
| f | 860 | 2.5 | 60 | 0.60 | 0.30 | 2.6 | 0.20 | 35.4 | remainder | 0.5 |
| g | 820 | 1.0 | 50 | 0.50 | 0.50 | 2.9 | 0.22 | 35.4 | remainder | 1.0 |
| h | 800 | 3 | 60 | 0.15 | 0.90 | 3.3 | 0 | 40 | remainder | 6.0 |
| i | 800 | 1 | 60 | 0.25 | 0.65 | 2.7 | 0 | 40 | remainder | 2.6 |

TABLE 5

| Formation condition set | First cooling step cooling rate (° C./min) | Maintenance step Maintaining temperature (° C.) | Maintenance step Maintaining time (min) | Second cooling step cooling rate (° C./min) |
|---|---|---|---|---|
| a | 15 | 750 | 90 | 8 |
| b | 15 | 750 | 40 | 8 |
| c | 15 | 750 | 30 | 7 |
| d | 15 | 750 | 180 | 10 |
| e | 15 | 700 | 60 | 8 |
| f | 15 | 750 | 240 | 10 |
| g | 15 | 750 | 300 | 10 |
| h | 3.5 | n/a | n/a | n/a |
| i | 10 | n/a | n/a | n/a | means a form of damage only with wear and without chipping or fracturing damage (having a smooth worn surface); the term "chipping" means a small fracturing damage present on a cutting edge portion for forming a finished surface; and the term "fracture" means a large fracturing damage present on a cutting edge portion.

<<Cutting Conditions of Cutting Test 1>>

Workpiece: FCD450 round bar

Peripheral speed: 300 m/min

Feed speed: 0.15 mm/rev

Cutting depth: 1.0 mm

Cutting fluid: used

TABLE 6

| Formation condition set | Minimum value of Al composition ratio x1 of $Ti_{1-x1}Al_{x1}N$ phase | Maximum value of Al composition ratio x2 of $Al_{x2}Ti_{1-x2}N$ phase | (Maximum value of x2) − (Minimum value of x1) | Average value of total thicknesses of $Ti_{1-x1}Al_{x1}N$ phases and $Al_{x2}Ti_{1-x2}N$ phases next to each other (nm) | Electron diffraction image pattern | P1/(P1 + P2) | Hardness of hard coating Hv (GPa) | Absolute value of residual stress (GPa) |
|---|---|---|---|---|---|---|---|---|
| a | 0.58 | 0.93 | 0.35 | 22 | concentric | 0.87 | 34.2 | 0.6 (compressive) |
| b | 0.63 | 0.95 | 0.32 | 20 | concentric | 0.81 | 33.5 | 0.6 (compressive) |
| c | 0.51 | 0.85 | 0.34 | 26 | concentric | 0.60 | 31.8 | 0.9 (compressive) |
| d | 0.58 | 0.85 | 0.27 | 29 | concentric | 0.50 | 31.0 | 1.0 (compressive) |
| e | 0.53 | 0.86 | 0.33 | 23 | concentric | 0.67 | 32.7 | 0.7 (compressive) |
| f | 0.64 | 0.90 | 0.26 | 38 | concentric | 0.24 | 29.5 | 1.3 (compressive) |
| g | 0.67 | 0.92 | 0.25 | 33 | concentric | 0.40 | 30.2 | 1.2 (compressive) |
| h | — | 0.85 | not measurable | not measurable | dot | 0.7 | 28.7 | 1.3 (compressive) |
| i | 0.25 | 0.95 | 0.7 | 8 | not measurable | not calculable | 35.5 | 0.7 (tensile) |

<Cutting Test>

Cutting tests 1 to 4 are performed using the cutting tools of samples Nos. 1 to 18 produced as described above.

<<Cutting Test 1: High-Speed Outer Periphery Cutting Test of Round Bar>>

The cutting tools of samples Nos. 1 to 7, 15, and 16 are used to determine the cutting times required for the amount of flank wear (Vb) to reach 0.20 mm under the cutting conditions of cutting test 1 described below, and the final damage forms of the cutting edges are observed. The results are shown in Table 7.

Note that the higher the value in a cell of cutting time in Tables 7 to 10 is, the longer the life of the cutting tool is. The description of final form of damage in Tables 7 to 10 represents wear resistance of the coating using the terms of wear, chipping, and fracture in descending order. In regard to final form of damage in Tables 7 to 10, the term "wear"

TABLE 7

| Sample No. | Cutting time (min) | Final damage form |
|---|---|---|
| 1 | 32 | wear |
| 2 | 35 | wear |
| 3 | 28 | wear |
| 4 | 27 | wear |
| 5 | 25 | wear |
| 6 | 35 | wear |
| 7 | 38 | wear |
| 15 | 20 | wear |
| 16 | 15 | chipping |

As shown in Table 7, it has been verified that the cutting tools of samples Nos. 1 to 7 have longer lives than the cutting tools of samples Nos. 15 and 16 in high-speed cutting.

Chipping was observed on the cutting tool of sample No. 16 whose hard coating is formed only of first crystalline phases each including a structure having a $Ti_{1-x1}Al_{x1}N$ ($0.1 \leq x1 \leq 0.5$) phase having a NaCl-type crystal structure and an $Al_{x2}Ti_{1-x2}N$ ($0.5 < x2 \leq 0.95$) phase having a NaCl-type crystal structure that are alternately stacked.

<<Cutting Test 2: Low-Speed Outer Periphery Cutting Test of Round Bar>>

The cutting tools of samples Nos. 1 to 7, 15, and 16 are used to determine the cutting times required for the amount of flank wear (Vb) to reach 0.20 mm under the cutting conditions of cutting test 2 described below, and the final damage forms of the cutting edges are observed. The results are shown in Table 8.

<<Cutting Conditions of Cutting Test 2>>
Workpiece: SCM415
Peripheral speed: 100 m/min
Feed speed: 0.15 mm/rev
Cutting depth: 1.0 mm
Cutting fluid: used

TABLE 8

| Sample No. | Cutting time (min) | Final damage form |
|---|---|---|
| 1 | 25 | wear |
| 2 | 30 | wear |
| 3 | 27 | wear |
| 4 | 25 | wear |
| 5 | 23 | wear |
| 6 | 35 | wear |
| 7 | 37 | wear |
| 15 | 19 | chipping |
| 16 | 20 | wear |

As shown in Table 8, it has been verified that the cutting tools of samples Nos. 1 to 7 have longer lives than the cutting tools of samples Nos. 15 and 16 also in low-speed cutting.

Chipping was observed on the cutting tool of sample No. 15 whose hard coating includes an $Al_{x2}Ti_{1-x2}N$ ($0.5 < x2 \leq 0.95$) phase having a NaCl-type crystal structure and a second crystalline phase containing AlN having a wurtzite-type crystal structure.

<<Cutting Test 3: Adhesion Resistance Test of Block Material>>

The cutting tools of samples Nos. 8 to 14, 17, and 18 are used to determine the cutting lengths when the amount of flank wear (Vb) reaches 0.20 mm under the cutting conditions of cutting test 3 described below, and the final damage forms of the cutting edges are observed. The results are shown in Table 9.

<<Cutting Conditions of Cutting Test 3>>
Workpiece: A5083P block material
Peripheral speed: 300 m/min
Feed speed: 0.3 mm/s
Cutting depth: 2.0 mm
Cutting fluid: used
Cutter: WGC4160R (product of Sumitomo Electric Hardmetal Corp.)

TABLE 9

| Sample No. | Cutting length (m) | Final damage form |
|---|---|---|
| 8 | 50 | wear |
| 9 | 55 | wear |
| 10 | 47 | wear |
| 11 | 30 | wear |
| 12 | 40 | wear |
| 13 | 35 | wear |
| 14 | 45 | wear |
| 17 | 28 | wear |
| 18 | 20 | fracture |

As shown in Table 9, it has been verified that the cutting tools of samples Nos. 8 to 14 have longer lives than the cutting tools of samples Nos. 17 and 18 in high-speed cutting.

Fracture has been observed in the cutting tool of sample No. 18 whose hard coating is formed only of first crystalline phases each including a structure having a $Ti_{1-x1}Al_{x1}N$ ($0.1 \leq x1 \leq 0.5$) phase having a NaCl-type crystal structure and an $Al_{x2}Ti_{1-x2}N$ ($0.5 < x2 \leq 0.95$) phase having a NaCl-type crystal structure that are alternately stacked.

<<Cutting Test 4: Adhesion Resistance Test of Block Material>>

The cutting tools of samples Nos. 8 to 14, 17, and 18 are used to determine the cutting lengths when the amount of flank wear (Vb) reaches 0.20 mm under the cutting conditions of cutting test 4 described below, and the final damage forms of the cutting edges are observed. The results are shown in Table 10.

<<Cutting Conditions of Cutting Test 4>>
Workpiece: S45C block material
Peripheral speed: 160 m/min
Feed speed: 0.3 mm/s
Cutting depth: 2.0 mm
Cutting fluid: not used
Cutter: WGC4160R (product of Sumitomo Electric Hardmetal Corp.)

TABLE 10

| Sample No. | Cutting length (m) | Final damage form |
|---|---|---|
| 8 | 10 | chipping |
| 9 | 12 | chipping |
| 10 | 9 | chipping |
| 11 | 8 | chipping |
| 12 | 12 | chipping |
| 13 | 10 | chipping |
| 14 | 12 | chipping |
| 17 | 7 | chipping |
| 18 | 2 | fracture |

As shown in Table 10, it has been verified that the cutting tools of samples Nos. 8 to 14 have longer lives than the cutting tools of samples Nos. 17 and 18 also in cutting test 4.

Fracture has been observed in the cutting tool of sample No. 18 whose hard coating is formed only of first crystalline phases each including a structure having a $Ti_{1-x1}Al_{x1}N$ ($0.1 \leq x1 \leq 0.5$) phase having a NaCl-type crystal structure and an $Al_{x2}Ti_{1-x2}N$ ($0.5 < x2 \leq 0.95$) phase having a NaCl-type crystal structure that are alternately stacked. Chipping has been observed in the other cutting tools of samples Nos. 8 to 14 and 17.

As described above, an embodiment and examples of the present invention have been described. Note that combination of configurations of the embodiment and the examples as appropriate is also originally intended.

The disclosed embodiment and examples are to be considered in all respects only illustrative and not restrictive. The scope of the invention is, therefore, indicated by the claims rather than by the foregoing embodiment. All changes that come within the meaning and range of equivalency of the claims are to be embraced within the scope of the present invention.

REFERENCE SIGNS LIST

10 CVD apparatus, 11 base member, 12 base member setting fixture, 13 reaction vessel, 14 temperature regulating device, 15 first gas introduction tube, 16 gas introduction tube, 17 second gas introduction tube, 18 gas exhaust pipe, 19 gas exhaust port, 20 substrate film, 21 first crystalline phase, 21a $Ti_{1-x1}Al_{x1}N$ layer, 21b $Al_{x2}Ti_{1-x2}N$ layer, 22 Second crystalline phase, 30 hard coating, 41 binodal line, 42 spinodal line, 50 coating

The invention claimed is:

1. A hard coating having a top surface and a bottom surface, comprising:
   two first crystalline phases; and
   a second crystalline phase disposed between said two first crystalline phases,
   wherein
   said two first crystalline phases each include, independently, a laminate structure having a $Ti_{1-x1}Al_{x1}N$ phase having a sodium chloride crystal structure, and an $Al_{x2}Ti_{1-x2}N$ phase having a sodium chloride crystal structure that are alternately stacked,
   an Al composition ratio x1 of said $Ti_{1-x1}Al_{x1}N$ phase satisfies a relationship $0.5 \leq x1 \leq 0.75$,
   an Al composition ratio x2 of said $Al_{x2}Ti_{1-x2}N$ phase satisfies a relationship $0.75 < x2 \leq 0.95$,
   said laminate structure includes a region in which an Al concentration periodically changes along a stacking direction of said $Ti_{1-x1}Al_{x1}N$ phase and said $Al_{x2}Ti_{1-x2}N$ phase,
   in said region, a difference between a maximum value of said Al composition ratio x2 and a minimum value of said Al composition ratio x1 is greater than 0.25,
   said second crystalline phase contains AlN having a wurtzite crystal structure,
   the second crystalline phase extends through the hard coating between the two first crystalline phases from the top surface of the hard coating continuously to the bottom surface of the hard coating, and
   said $Ti_{1-x1}Al_{x1}N$ phase and said $Al_{x2}Ti_{1-x2}N$ phase are alternately stacked along the direction from the top surface and the bottom surface of the hard coating.

2. The hard coating according to claim 1, wherein a total thickness of a per-phase thickness of said $Ti_{1-x1}Al_{x1}N$ phase and a per-phase thickness of said $Al_{x2}Ti_{1-x2}N$ phase, the phases located next to each other, is greater than or equal to 1 nm and less than or equal to 50 nm.

3. The hard coating according to claim 1, wherein
an electron diffraction image of said second crystalline phase by a transmission electron microscope exhibits a concentric pattern, and
a ratio of a diffraction intensity P1 of a (200) plane of said $Al_{x2}Ti_{1-x2}N$ phase to a sum of said diffraction intensity P1 and a diffraction intensity P2 of a (100) plane of said second crystalline phase in an X-ray diffraction pattern of said hard coating by an X-ray diffraction method is greater than or equal to 0.2 and less than or equal to 1.

4. The hard coating according to claim 1, wherein an indentation hardness of said hard coating determined by a nanoindentation method is greater than or equal to 30 GPa.

5. The hard coating according to claim 1, wherein an absolute value of compressive residual stress of said $Al_{x2}Ti_{1-x2}N$ phase is greater than or equal to 0.3 GPa and less than or equal to 3 GPa.

6. The hard coating according to claim 1, wherein the second crystalline phase extends in a thickness direction of the hard coating.

7. The hard coating according to claim 1, wherein said stacking direction of said $Ti_{1-x1}Al_{x1}N$ phase and said $Al_{x2}Ti_{1-x2}N$ phase extends in a thickness direction of the hard coating.

8. A cutting tool comprising:
   a base member; and
   a hard coating on said base member and having a top surface and a bottom surface, comprising:
     two first crystalline phases; and
     a second crystalline phase disposed between said two first crystalline phases,
   wherein
   said two first crystalline phases each include, independently, a laminate structure having a $Ti_{1-x1}Al_{x1}N$ phase having a sodium chloride crystal structure, and an $Al_{x2}Ti_{1-x2}N$ phase having a sodium chloride crystal structure that are alternately stacked,
   an Al composition ratio x1 of said $Ti_{1-x1}Al_{x1}N$ phase satisfies a relationship $0.5 \leq x1 \leq 0.75$,
   an Al composition ratio x2 of said $Al_{x2}Ti_{1-x2}N$ phase satisfies a relationship $0.75 < x2 \leq 0.95$,
   said laminate structure includes a region in which an Al concentration periodically changes along a stacking direction of said $Ti_{1-x1}Al_{x1}N$ phase and said $Al_{x2}Ti_{1-x2}N$ phase,
   in said region, a difference between a maximum value of said Al composition ratio x2 and a minimum value of said Al composition ratio x1 is greater than 0.25,
   said second crystalline phase contains AlN having a wurtzite crystal structure,
   the second crystalline phase extends through the hard coating between the two first crystalline phases from the top surface of the hard coating continuously to the bottom surface of the hard coating,
   the bottom surface is arranged on a side of the base member, and
   the top surface is arranged opposite to the bottom surface.

* * * * *